(12) United States Patent
Ashburn, Jr. et al.

(10) Patent No.: US 8,570,200 B2
(45) Date of Patent: Oct. 29, 2013

(54) CONTINUOUS-TIME OVERSAMPLED CONVERTER HAVING ENHANCED IMMUNITY TO NOISE

(75) Inventors: Michael A. Ashburn, Jr., Groton, MA (US); Jeffrey Carl Gealow, Andover, MA (US); Paul F. Ferguson, Jr., North Andover, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 49 days.

(21) Appl. No.: 13/337,143

(22) Filed: Dec. 25, 2011

(65) Prior Publication Data

US 2012/0188107 A1    Jul. 26, 2012

Related U.S. Application Data

(60) Provisional application No. 61/434,692, filed on Jan. 20, 2011.

(51) Int. Cl.
*H03M 3/00* (2006.01)

(52) U.S. Cl.
USPC .......................................... 341/143; 341/155

(58) Field of Classification Search
USPC .......................................... 341/143, 144, 155
See application file for complete search history.

(56) References Cited

U.S. PATENT DOCUMENTS

| 5,245,345 A * | 9/1993 | Kohdaka et al. ............. 341/152 |
| 5,313,205 A | 5/1994 | Wilson |
| 5,450,083 A | 9/1995 | Brewer |
| 5,786,778 A | 7/1998 | Adams |
| 6,177,896 B1 * | 1/2001 | Min ............................. 341/143 |
| 6,614,374 B1 | 9/2003 | Gustavsson |
| 6,894,632 B1 | 5/2005 | Robinson |
| 7,423,567 B2 * | 9/2008 | Melanson ..................... 341/143 |
| 7,460,831 B2 | 12/2008 | Hasarchi |
| 7,479,912 B1 | 1/2009 | Xianggang |
| 7,696,913 B2 * | 4/2010 | Melanson ..................... 341/143 |
| 7,720,160 B1 | 5/2010 | Gorecki |
| 7,825,844 B2 * | 11/2010 | Ballantyne ................... 341/144 |
| 8,044,836 B2 * | 10/2011 | Zeller .......................... 341/143 |
| 2004/0140922 A1 * | 7/2004 | Melanson et al. ............ 341/144 |
| 2011/0221533 A1 * | 9/2011 | Lesso ........................... 330/297 |
| 2012/0133406 A1 * | 5/2012 | Fant et al. .................... 327/167 |

OTHER PUBLICATIONS

"International Search Report" mailed on Apr. 24, 2012 for International application No. PCT/US2012/020379, International filing date: Jan. 5, 2012.
Oliaei, "Sigma-Delta Modulator With Spectrally Shaped Feedback", IEEE Transactions on Circuits and Systems-II: Analog and Digital Signal Processing, pp. 518-530, vol. 50, No. 9, Sep. 2003.

\* cited by examiner

*Primary Examiner* — Peguy Jean Pierre
(74) *Attorney, Agent, or Firm* — Winston Hsu; Scott Margo

(57) ABSTRACT

An apparatus includes a clock source and an oversampled continuous-time digital-to-analog converter. Noise signal is added to the clock signal as the clock signal is generated and/or routed. The oversampled continuous-time digital-to-analog converter includes a sigma-delta modulator to perform noise shaping on input data samples and provide intermediate data samples; a filter to filter the intermediate data samples and generate filtered samples, the filter having a transfer function that has a stop band at a frequency range that includes the frequency of the noise signal or a component of the noise signal; and a continuous-time digital-to-analog converter to convert the filtered samples to an output analog signal.

30 Claims, 19 Drawing Sheets

CONTINUOUS-TIME OVERSAMPLED CONVERTER HAVING ENHANCED IMMUNITY TO NOISE

CROSS REFERENCE TO RELATED APPLICATIONS

This application claims the benefit of U.S. Provisional Application No. 61/434,692, filed Jan. 20, 2011 and incorporated herein by reference.

BACKGROUND

Continuous-time analog-to-digital converters (CT ADCs) and continuous-time digital-to-analog converters (CT DACs) are distinguished from their discrete-time counterparts (DT ADCs and DT DACs) in that sampling is not used in their front-end circuitry. Rather, in the case of a continuous-time ADC, some form of filtering or analog processing is employed prior to sampling (or storing) the input waveform as part of the eventual digitization. In the case of the continuous-time DAC, no sampling is used. This continuous-time approach has several advantages as compared to using a discrete-time converter. For example, two benefits of using continuous-time ADC or DAC are reduced sensitivity to coupled noise and the potential for lower power implementations.

The power and noise sensitivity benefits of continuous-time converters can be understood by comparing and contrasting their performance with that of a discrete-time converter. FIG. 1A shows an example of a conventional discrete-time DAC. The discrete-time DAC is implemented using a switched-capacitor (S-C) strategy. Depending on the DAC input code, certain capacitors on the left ($C_{IN1}, C_{IN2}, \ldots C_{INn}$) are first charged to a reference voltage $V_{REF}$. While the selected input capacitors are being charged to $V_{REF}$, an integrating capacitor $C_{FB}$ placed between the output of an amplifier $A_1$ and its inverting terminal, is reset by closing a switch $S_1$. Next, the charge stored on the selected input capacitors is transferred to the capacitor $C_{FB}$ when the selected input capacitors are connected between the inverting ("−") terminal of the amplifier $A_1$ and ground. Because the input capacitors are selected by the digital input to the DAC, the magnitude of the charge that is transferred to the capacitor $C_{FB}$, and therefore the voltage across it, is also dependent on the input code to the DAC. A sample-and-hold (S/H) circuit can be placed after the amplifier $A_1$ in order to hold the output value from the amplifier $A_1$ during settling and reset.

FIG. 1B shows a conventional continuous-time DAC implementation using a current DAC (IDAC). Positive and negative weighted current sources ($I_{1p}, I_{1n}, I_{2p}, I_{2n}, \ldots I_{np}, I_{nn}$) are selected as mapped from a given DAC code. Each selected current is connected to the inverting input of an amplifier $A_2$. The amplifier stage is configured as a low-pass trans-impedance stage with a feedback resistor $R_{FB}$ connected in parallel with a feedback capacitor $C_{FB}$. The feedback resistor $R_{FB}$ then develops a voltage proportional to the total current connected to the inverting terminal of the amplifier $A_2$. Since the input currents are selected by the input DAC code, there is a direct mapping from the input code to its output voltage. The capacitor $C_{FB}$ provides the aforementioned low-pass characteristic of the stage by smoothing the output voltage transitions as DAC codes are changed.

SUMMARY

In general, in one aspect, an apparatus includes a clock source and an oversampled continuous-time digital-to-analog converter. The clock source generates a clock signal in which a noise signal may be added to the clock signal as the clock signal is generated and/or routed. The continuous-time digital-to-analog converter includes a sigma-delta modulator to perform noise shaping on input digital data samples and provide intermediate data samples; a filter to filter the intermediate data samples and generate filtered samples, the filter having a transfer function that has a stop band at a frequency range that includes the frequency of the noise signal or a component of the noise signal; and a continuous-time digital-to-analog converter to convert the filtered samples to an output analog signal. The clock signal or a signal derived from the clock signal is used by one or more components of the oversampled continuous-time digital-to-analog converter.

Implementations of the apparatus may include one or more of the following features. Noise signals having a plurality of frequencies may be added to the clock signal as the clock signal is generated and/or routed, in which the filter transfer function has notches at frequencies that match the frequencies of the noise signals or components of the noise signals. The noise signal in the clock signal can be coupled to the oversampled continuous-time digital-to-analog converter through a power line, a ground line, or a substrate on which the oversampled continuous-time digital-to-analog converter is located. The filter transfer function can have a notch at a frequency that matches the frequency of the noise signal or a component of the noise signal. The clock source can include a phase-locked loop having a reference clock operating at a reference clock frequency, and the notch in the filter transfer function can be set at a frequency that matches the reference clock frequency or a harmonic of the reference clock frequency. The phase-locked loop can include an integer-N phase-locked loop. The phase-locked loop can include a fractional-N phase-locked loop. The filter transfer function can have a plurality of notches at frequencies that match two or more of the reference clock frequency and harmonics of the reference clock frequency. The clock source can include a delay-locked loop having a reference clock operating at a reference clock frequency, and the notch in the filter transfer function can be set at a frequency that matches the reference clock frequency or a harmonic of the reference clock frequency. The clock source can include a calibrated oscillator with periodic re-calibration.

The input digital data samples can be associated with an analog signal having component frequencies within a frequency band of interest, and the sigma-delta modulator can perform noise shaping on the input data samples to reduce quantization noise of the filtered samples within the frequency band of interest and place some of the quantization noise outside of the frequency band of interest, in which the stop band of the filter is outside of the frequency band of interest. The filter can include a finite impulse response (FIR) filter, an infinite impulse response (IIR) filter, or a combination of an FIR filter and an IIR filter. The filter can include a sinc filter. The filter can include a programmable filter. The programmable filter can have programmable coefficients that are selected to match the stop band to the frequency of the noise signal or a component of the noise signal. The filter transfer function can have a notch, and the programmable coefficients can be selected to match the notch frequency to the frequency of the noise signal or a component of the noise signal. The noise signal can be generated by a source outside of the clock source. The source of the noise signal can include a charge-pump or a switched-mode power supply. The filter and the continuous-time digital-to-analog converter can be partially integrated as a finite impulse response digital-to-analog converter. The filter can be implemented as part of the continuous-time digital-to-analog converter. The continuous-time digital-to-analog converter can include weighted current sources that are selected based on digital code in the filtered samples.

In general, in another aspect, an apparatus includes a clock source to generate a clock signal in which a noise signal is added to the clock signal as the clock signal is generated and/or routed; and an oversampled continuous-time analog-to-digital converter to convert an input analog signal to an output digital signal. The oversampled continuous-time analog-to-digital converter includes a quantizer to quantize a first intermediate signal and generate the output digital signal; a first filter to filter the output digital signal and generate a first filtered digital signal, the first filter having a transfer function that has a stop band at a frequency range that includes the frequency of the noise signal or a component of the noise signal; a first feedback continuous-time digital-to-analog converter to convert the first filtered digital signal to a first analog representation of the first filtered digital signal; and a first circuit to generate a second intermediate signal representing a difference between the input analog signal and the first analog representation of the first filtered digital signal. The clock signal or a signal derived from the clock signal is used by one or more components of the oversampled continuous-time analog-to-digital converter.

Implementations of the apparatus may include one or more of the following features. Noise signals having a plurality of frequencies may be added to the clock signal as the clock signal is generated and/or routed, in which the first filter transfer function can have notches at frequencies that match the frequencies of the noise signals or components of the noise signals. The noise signal in the clock signal can be coupled to the oversampled continuous-time analog-to-digital converter through a power line, a ground line, or a substrate on which the oversampled continuous-time analog-to-digital converter is located. The first filter transfer function can have a notch at a frequency that matches the frequency of the noise signal or a component of the noise signal.

The clock source can include a phase-locked loop having a reference clock operating at a reference clock frequency, and the notch in the first filter transfer function can have a frequency that matches the reference clock frequency or a harmonic of the reference clock frequency. The phase-locked loop can include an integer-N phase-locked loop. The phase-locked loop can include a fractional-N phase-locked loop. The first filter transfer function can have a plurality of notches at frequencies that match two or more of the reference clock frequency and harmonics of the reference clock frequency. The clock source can include a delay-locked loop having a reference clock operating at a reference clock frequency, and the first filter transfer function can have a notch at a frequency that matches the reference clock frequency or a harmonic of the reference clock frequency. The clock source can include a calibrated oscillator with periodic re-calibration. The input analog signal can have component frequencies within a frequency band of interest.

The quantizer, the first filter, the feedback digital-to-analog converter, and the first circuit can form a sigma-delta modulator that performs noise shaping to reduce quantization noise of the output digital signal within the frequency band of interest and place some of the quantization noise outside of the frequency band of interest. The stop band can be outside of the frequency band of interest. The first filter can include a finite impulse response (FIR) filter, an infinite impulse response (IIR) filter, or a combination of an FIR filter and an IIR filter. The first filter can include a programmable filter. The programmable filter can have programmable coefficients that are selected to match the stop band to the frequency of the noise signal or a component of the noise signal. The first filter transfer function can have a notch, and the programmable coefficients can be selected to match the notch frequency to the frequency of the noise signal or a component of the noise signal. The noise signal can be generated by a source outside of the clock source. The source of the noise signal can include a charge-pump or a switched-mode power supply.

The apparatus can include a second filter to filter the output digital signal and generate a second filtered digital signal; a second feedback continuous-time digital-to-analog converter to convert the second filtered digital signal to a second analog representation of the second filtered digital signal; and a second circuit to generate a third intermediate signal representing a difference between a processed version of the second intermediate signal and the second analog representation of the second filtered digital signal. The first filter can include a sinc filter and the second filter can include a finite impulse response filter. The sinc filter can include a programmable filter having programmable coefficients that are selected to match a notch frequency of the transfer function of the sinc filter to the frequency of the noise signal or a component of the noise signal. The first feedback continuous-time digital-to-analog converter can include weighted current sources that are selected based on digital code.

In general, in another aspect, an apparatus includes an oversampled continuous-time digital-to-analog converter. The oversampled continuous-time digital-to-analog converter includes a first filter to filter an oversampled digital signal and generate a filtered oversampled digital signal, the filter having a transfer function that has a stop band at a frequency range that includes the frequency of a noise signal, the stop band being outside of a frequency band of interest; a continuous-time digital-to-analog converter to convert the filtered samples to a first analog signal; and a second filter to filter the first analog signal and generate an output analog signal, the second filter reducing components in the output analog signal having frequencies outside of the frequency band of interest.

Implementations of the apparatus may include one or more of the following features. The apparatus can include a clock source that generates a clock signal in which a phase noise peak may be added to a noise level of the clock signal as the clock signal is generated and/or routed, in which the first filter transfer function includes a notch that occurs at a frequency that matches the frequency of the noise peak. The sampling component can include a sigma-delta modulator.

In general, in another aspect, an apparatus includes an oversampled continuous-time analog-to-digital converter to convert an input analog signal to an output digital signal, the oversampled continuous-time analog-to-digital converter includes a quantizer to quantize a first intermediate signal and generate the output digital signal; a first filter to filter the output digital signal and generate a first filtered digital signal, the first filter having a transfer function having a stop band at a frequency range that includes the frequency of a noise signal; a first feedback continuous-time digital-to-analog converter to convert the first filtered digital signal to a first analog representation of the first filtered digital signal; and a first circuit to generate a second intermediate signal representing a difference between the input analog signal and the first analog representation of the first filtered digital signal.

Implementations of the apparatus may include one or more of the following features. The apparatus can include a clock source that generates a clock signal in which phase noise peaks are added to a noise level of the clock signal as the clock signal is generated and/or routed, in which the first filter transfer function includes a notch that occurs at a frequency that matches at least one frequency of the noise peaks. The apparatus can include a second filter to filter the output digital signal and generate a second filtered digital signal, the second filter compensating for feedback delays produced by the first filter; and a second feedback continuous-time digital-to-analog converter to convert the second filtered digital signal to a third intermediate signal that is fed into a second feedback loop. The first filter can include a sinc filter and the second filter can include a finite impulse response filter.

In general, in another aspect, an apparatus includes an oversampled continuous-time converter to convert an input signal into an output signal having a format that is different from the input signal. The continuous-time oversampled converter includes a filter to filter an oversampled digital signal and generate a filtered signal, the filter having a transfer function having a stop band at a frequency range that includes a frequency of a noise signal, the stop band being outside of a frequency band of interest; and a continuous-time digital-to-analog converter to convert the filtered signal to an analog signal.

Implementations of the apparatus may include one or more of the following features. The oversampled continuous-time converter can include an oversampled continuous-time digital-to-analog converter, the input signal can include a digital signal, and the output signal can include the analog signal or a filtered version of the analog signal. The oversampled continuous-time converter can include an oversampled continuous-time analog-to-digital converter having a quantizer that generates the oversampled digital signal, and the analog signal from the continuous-time digital-to-analog converter can be fed into a feedback loop. The filter transfer function can have a notch at a frequency that matches the frequency of the noise signal or a component of the noise signal.

In general, in another aspect, a method of converting input digital data samples to an output analog signal is provided. The method includes routing a clock signal having a noise signal; filtering oversampled digital data having components outside of a signal band of interest, by using a filter having a transfer function that has a stop band at a frequency that matches the frequency of the noise signal or a component of the noise signal, to generate filtered samples, the stop band being outside of the signal band of interest; and converting, using a continuous-time digital-to-analog converter, the filtered samples to an output analog signal.

Implementations of the method may include one or more of the following features. Noise signals having a plurality of frequencies may be added to the clock signal as the clock signal is generated and/or routed, and the filtering can include using a filter having a transfer function that has notches at frequencies that match the frequencies of the noise signals or components of the noise signals. Generating a clock signal can include generating a clock signal using a phase-locked loop having a reference clock operating at a reference clock frequency, and the method can include setting a notch in the filter transfer function at a frequency that matches the reference clock frequency or a harmonic of the reference clock frequency. The filter transfer function can have a plurality of notches at frequencies that match two or more of the reference clock frequency and harmonics of the reference clock frequency. Filtering the intermediate data samples can include using a sinc filter to filter the intermediate data samples. Filtering the intermediate data samples can include using a programmable filter to filter the intermediate data samples, and the method can include selecting programmable coefficients of the programmable filter such that the stop band matches the frequency of the noise signal or a component of the noise signal. Converting the filtered samples to an output analog signal can include selecting weighed current sources based on digital code.

In general, in another aspect, a method of converting an input analog signal to an output digital signal is provided. The method includes generating a clock signal; routing the clock signal, in which a noise signal is added to the clock signal as the clock signal is generated and/or routed; quantizing a first intermediate signal and generating an output digital signal; filtering the output digital signal and generating a filtered digital signal using a filter having a transfer function that has a stop band at a frequency range that includes the frequency of the noise signal or a component of the noise signal; converting, using a feedback continuous-time digital-to-analog converter, the filtered digital signal to an analog representation of the filtered digital signal; and generating a second intermediate signal representing a difference between an input analog signal and the analog representation of the filtered digital signal.

Implementations of the method may include one or more of the following features. Noise signals having a plurality of frequencies may be added to the clock signal as the clock signal is generated and/or routed, and the filtering can include using a first filter that has a transfer function having notches at frequencies that match the frequencies of the noise signals or components of the noise signals. Generating a clock signal can include generating a clock signal using a phase-locked loop having a reference clock operating at a reference clock frequency, and the method can include setting a notch in the first filter transfer function at a frequency that matches the reference clock frequency or a harmonic of the reference clock frequency. The first filter transfer function can have a plurality of notches at frequencies that match two or more of the reference clock frequency and harmonics of the reference clock frequency. Filtering the output digital signal can include using a sinc filter to filter the output digital signal. Filtering the output digital signal can include using a programmable filter to filter the output digital signal. The method can include selecting programmable coefficients of the programmable filter such that the stop band matches the frequency of the noise signal or a component of the noise signal. The filter transfer function can have a notch. The programmable coefficients of the programmable filter can be selected such that the notch frequency matches the frequency of the noise signal or a component of the noise signal. Converting the filtered digital signal to an analog representation of the output digital signal can include selecting weighed current sources based on digital code.

In general, in another aspect, an apparatus includes an oversampled continuous-time digital-to-analog converter to convert digital input data to analog output data. The oversampled continuous-time digital-to-analog converter includes a filter to filter oversampled data and generate filtered data, the filter having a transfer function that has a stop band at a frequency range that is outside a signal band of interest and includes the frequency of a noise component of a clock signal; and a continuous-time digital-to-analog converter to convert the filtered data to the analog output signal, the continuous-time digital-to-analog converter using the clock signal or another signal derived from the clock signal.

Implementations of the apparatus may include one or more of the following features. The filter transfer function can include a notch at a frequency that matches the frequency of the noise signal or a component of the noise signal. The frequency of the noise signal can correspond to the frequency of a reference clock signal or a harmonic frequency of the reference clock signal.

In general, in another aspect, an apparatus includes an oversampled continuous-time analog-to-digital converter to convert an analog input signal to a digital output signal. The oversampled continuous-time analog-to-digital converter includes a quantizer to quantize a first intermediate signal and generate the output digital signal; a filter to filter the output digital signal and generate a filtered digital signal, the filter having a transfer function that has a stop band at a frequency range that is outside a signal band of interest and includes the frequency of a noise component of a clock signal; a feedback continuous-time digital-to-analog converter to convert the filtered digital signal to an analog representation of the filtered digital signal, the continuous-time digital-to-analog converter using the clock signal or another signal derived from the clock signal; and a circuit to generate a second intermediate signal representing a difference between the analog input signal and the analog representation of the filtered digital signal.

Implementations of the apparatus may include one or more of the following features. The filter transfer function can include a notch at a frequency that matches the frequency of the noise signal or a component of the noise signal. The frequency of the noise signal can correspond to the frequency of a reference clock signal or a harmonic frequency of the reference clock signal.

These and other objectives of the present invention will no doubt become obvious to those of ordinary skill in the art after reading the following detailed description of the preferred embodiment that is illustrated in the various figures and drawings.

DETAILED DESCRIPTION

Continuous-time DACs are sensitive to clock jitter. When high frequency phase noise (appearing as jitter) is present on a clock signal used to drive a DAC, large spurs in the clock spectrum can mix DAC output content at nearby frequencies into the baseband signal range and degrade the performance of the DAC. The same applies to continuous-time ADCs. In some implementations of an oversampled continuous time DAC, a filter having notch frequencies matching those of the noise spurs in the clock signal is used to remove or reduce out-of-band content of continuous-time DAC input signals at or near the frequencies of the noise spurs. Similarly, in an oversampled continuous-time ADC using one or more continuous-time feedback DACs, a filter having notch frequencies matching those of the noise spurs in the clock signal is used to remove or reduce out-of-band content of the input signals to each continuous-time feedback DAC at or near the frequencies of the noise spurs. This way, the out-of-band content mixed into the baseband signal range due to the clock spurs is considerably reduced, improving the performance of the oversampled continuous-time DAC and oversampled continuous-time ADC.

The oversampled continuous-time DAC may have another filter, sometimes referred to as the reconstruction filter, at the output of the continuous-time DAC to reduce out-of-band noise. Examples of oversampled continuous-time DACs and oversampled continuous-time ADCs include continuous-time sigma-delta (Σ-Δ) DACs and continuous-time sigma-delta ADCs. Other types of oversampled continuous-time DACs and oversampled continuous-time ADCs may also be used.

In an oversampled continuous-time DAC, placing a filter in front of a continuous-time DAC to filter the input signal of the continuous-time DAC has the advantage that the signal content mixed into the baseband signal range due to the clock spurs can be greatly reduced. By comparison, in a conventional oversampled continuous-time DAC where a filter is only placed after the continuous-time DAC to filter the output signal of the continuous-time DAC, the signal content mixed into baseband due to clock spurs will not be attenuated. Without placing a filter before the DAC to filter out-of-band content, the filter may be able to remove noise outside of the baseband signal range, but not able to remove or reduce the out-of-band signal content that is already mixed into the baseband signal range without also removing the desired signal.

Similarly, in an oversampled continuous-time ADC, placing a filter in front of some or all of the continuous-time feedback DACs to filter the input signal of the continuous-time feedback DAC has the advantage that the signal content mixed into the baseband signal range due to the clock spurs is greatly reduced.

Improved Continuous-Time Σ-Δ DAC

Figure 1A:
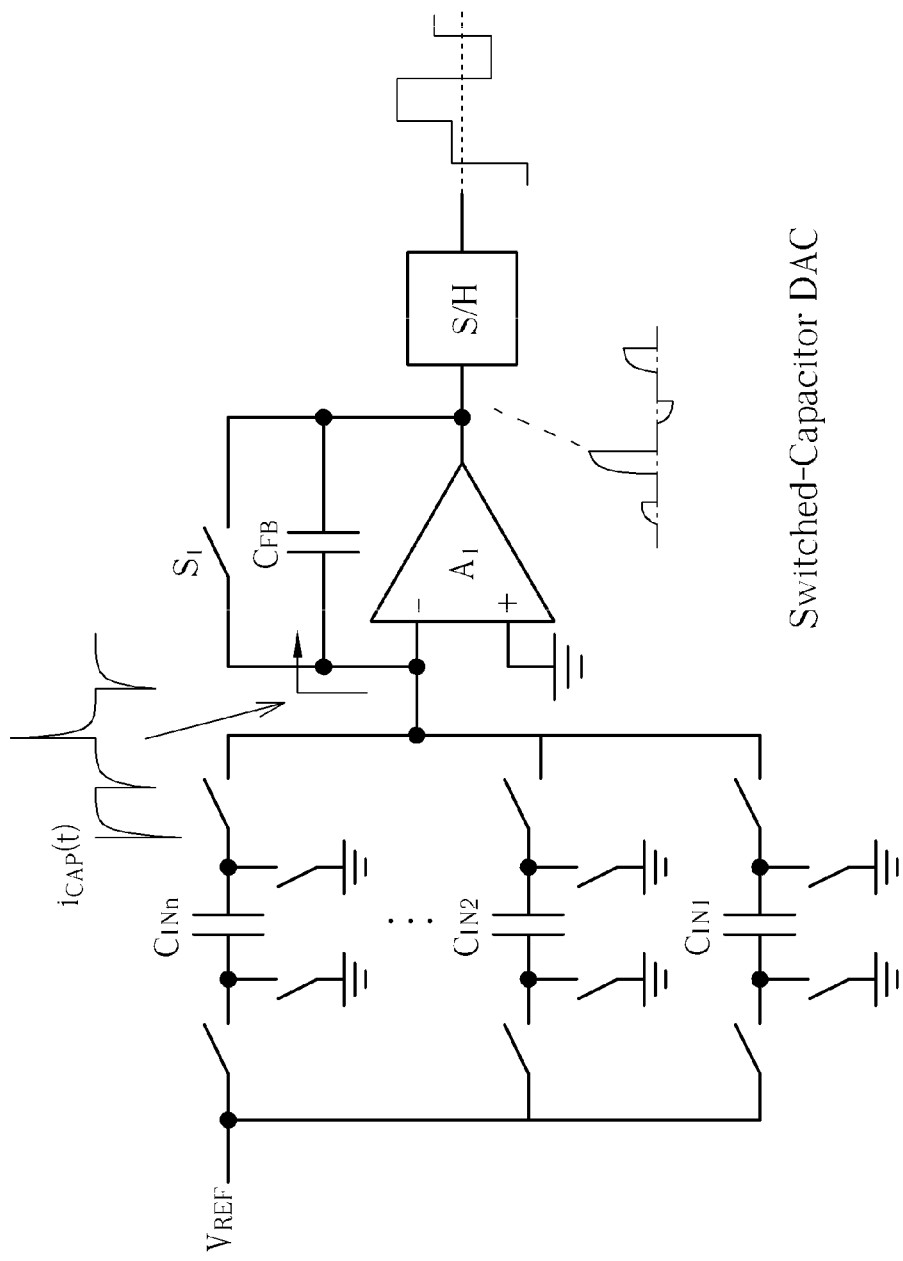
FIG. 1A is a diagram of an example conventional discrete-time DAC.
Figure 1B:
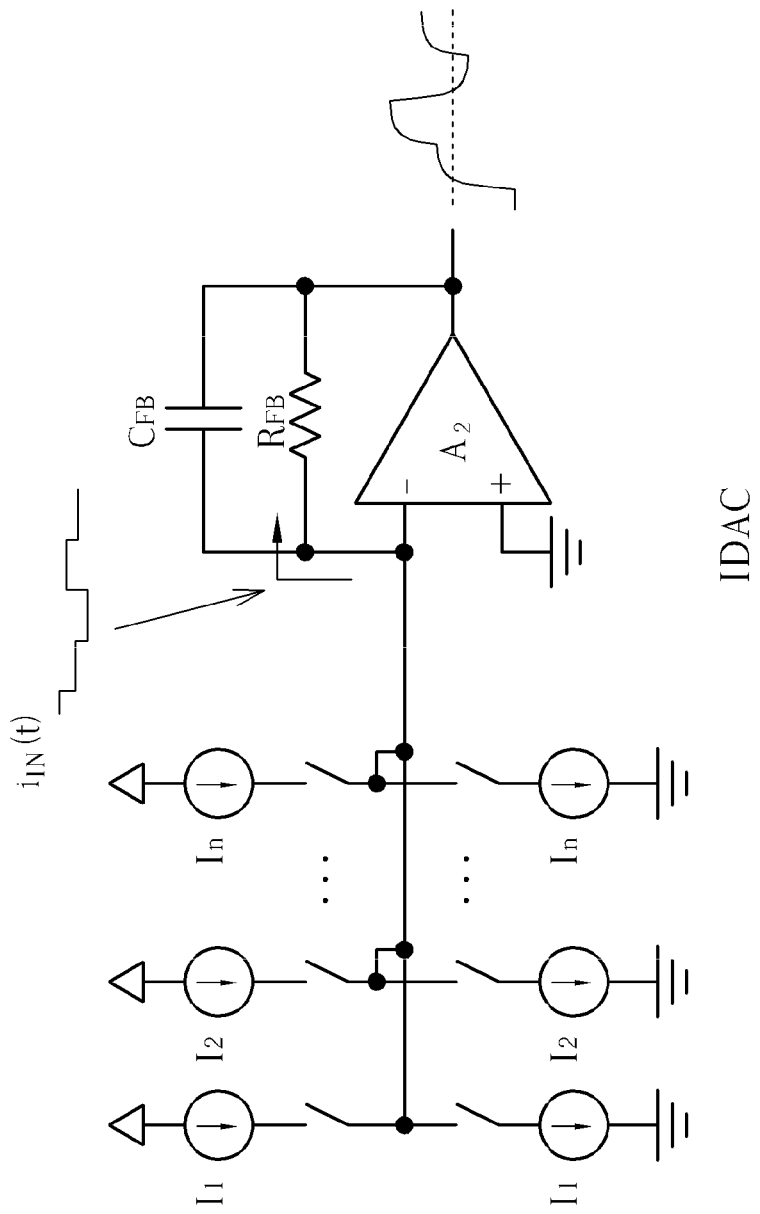
FIG. 1B is a diagram of an example conventional continuous-time DAC.
Figure 2:
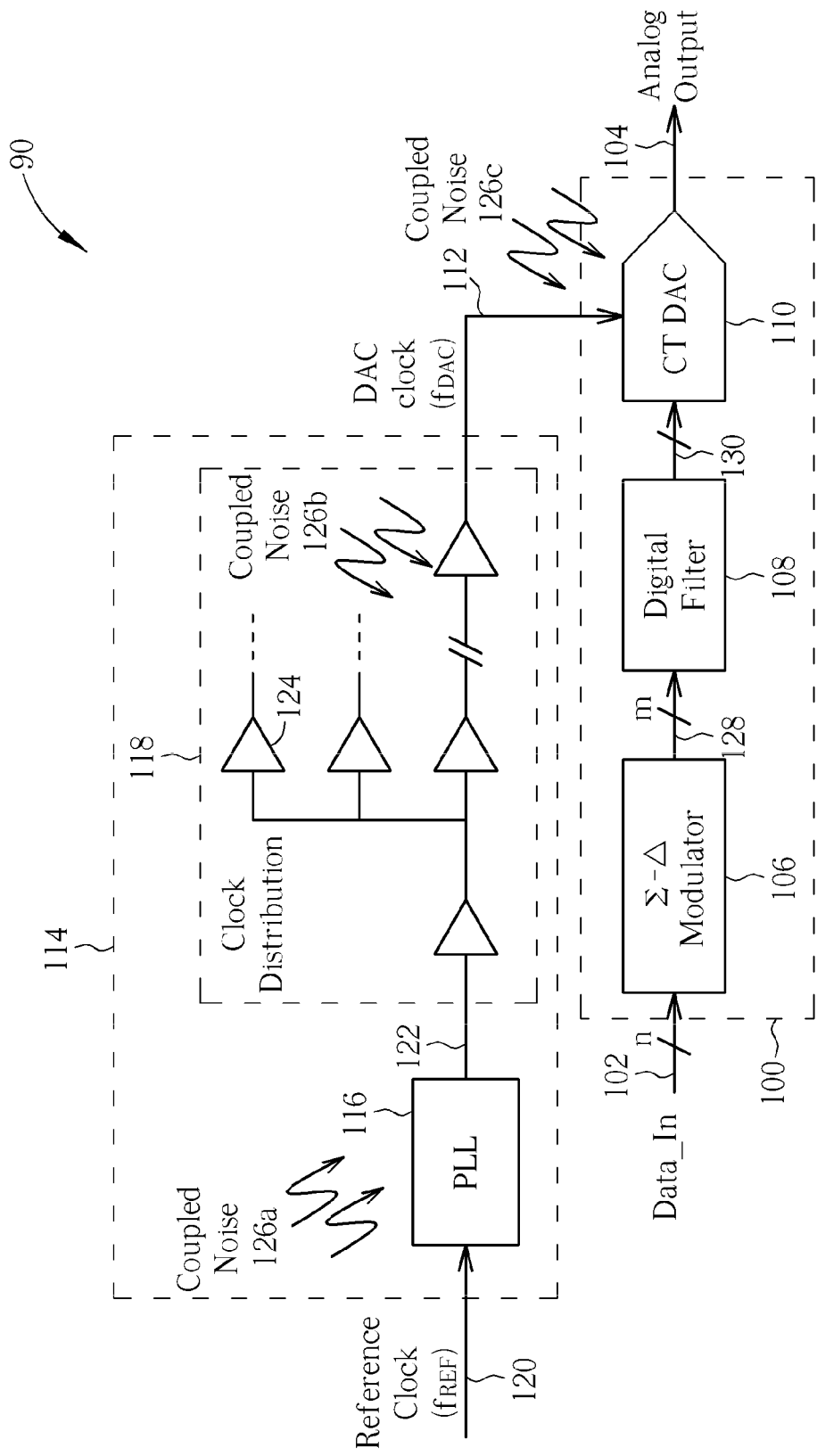
FIG. 2 is a diagram of a continuous-time Σ-Δ DAC having a digital filter inserted in the signal path.

Referring to FIG. 2, in some implementations, a system 90 includes a continuous-time sigma-delta DAC 100 that converts digital input data (Data_In) 102 into an analog output signal 104. The continuous-time sigma-delta DAC 100 includes a sigma-delta modulator (Σ-Δ modulator) 106, a digital filter 108, and a continuous-time DAC 110. The sigma-delta modulator 106 controls the switching of the continuous-time DAC (CT DAC) 110 such that the most errors resulting from finite resolution in the continuous-time DAC 110 and mismatches among elements (components) within the continuous-time DAC 110 can be placed at frequencies outside of the baseband in the analog output signal 104. This reduces the errors within the baseband.

The continuous-time sigma-delta DAC 100 can be, e.g., connected in series with a digital signal processor, or be part of a mixed-signal processing chain. The DAC 100 can be part of a system-on-a-chip that includes analog and digital circuitry. The system 90 can be any electronic device that uses a digital-to-analog converter, such as an audio decoder or video decoder. The continuous-time sigma-delta DAC 100 is useful in mobile devices, e.g., mobile phones, laptop computers, or tablet computers.

The continuous-time DAC 110 receives a clock signal 112 (e.g., a DAC clock with the frequency $f_{DAC}$) from a clock generation and distribution circuit (or clock tree) 114, which includes a phase-locked-loop (PLL) 116 and a clock distribution network 118. The phase-locked-loop 116 receives a reference clock 120 and outputs a clock signal 122 having a higher frequency compared to the reference clock 120. The clock distribution network 118 includes a system of buffers 124 that locally amplify the PLL output clock signal 122 so that it can be sent to various parts of the system 90. The clock distribution network 118 may have dividers (not shown in the figure) that generate clock signals having lower frequencies compared to the PLL output clock signal 122.

In some examples, the continuous-time sigma-delta DAC 100 and the clock generation and distribution circuit 114 are incorporated in an integrated circuit. The reference clock 120 can be, e.g., generated by a crystal oscillator or provided from an off-chip source. The reference clock 120 may contribute phase noise to the clock signal 112 that is delivered to the continuous-time DAC 110. Noise can be coupled at various locations in the clock distribution path. For example, noise may be coupled into the clock signal through the phase-locked-loop 116 (as indicated by reference numeral 126a), through buffers 124 in the clock distribution network 118 (as indicated by reference numeral 126b), and/or through a signal line transmitting the clock signal from the clock generation and distribution circuit 114 to the continuous-time DAC 110 (as indicated by reference numeral 126c). In addition, noise can be coupled through, e.g., the power supplies, ground, substrate on which the DAC integrated circuit is fabricated, and/or reference voltages. As higher integration levels are achieved through shrinking fabrication process geometries, components on integrated circuits are placed more closely together, resulting in an increase in noise coupling.

The digital filter 108 is placed in series between the sigma-delta modulator 106 and the continuous-time DAC 110. The digital filter 108 is designed to receive an output signal 128 from the sigma-delta modulator 106, and filter out-of-band content in the output signal 128 at frequencies that match or closely match the frequencies of the noise spurs in the clock signal 112. The digital filter 108 outputs a filtered signal 130 to the continuous-time DAC 110, in which the magnitude of the output signal 128 at frequencies at or near the frequencies of the noise spurs on the clock signal 112 is attenuated. This way, the out-of-band content in the output signal 128 of the sigma-delta modulator 106 that is mixed into the baseband signal range due to the clock spurs is considerably reduced. The baseband noise resulting from the mixing process can be greatly attenuated.

In some implementations, the frequencies of major noise spurs in the clock signal are known. For example, noise spurs may occur at frequencies equal to integer multiples of the frequency $f_{REF}$ of the reference clock signal 120. Noise spurs may occur at frequencies equal to integer multiples of the frequency of a charge pump (or a switched-mode power supply) positioned near the continuous-time sigma-delta DAC 100 or the clock generation and distribution circuit 114.

The digital filter 108 can be implemented using many types of filters. For example, referring to FIG. 3, the digital filter 108 can be an N-tap sinc filter 140 that has notches positioned at frequencies that match or are close to the frequencies of the major noise spurs. In this example, the sinc filter 140 is implemented with (N−1) delays 142 and N taps 144. The delayed input values are scaled inversely with the number of taps. The net effect of this implementation is to generate a moving average of the input to the filter. The digital filter 108, instead of having one or more notches at particular frequencies, can have one or more stop bands at particular frequency ranges. For example, if the major noise spurs occur at 1 MHz and 2 MHz, the digital filter 108 can be configured to have stop bands at frequency ranges 0.8 to 1.2 MHz and 1.8 to 2.2 MHz. In general, the stop band of a bandstop filter refers to the range of frequencies in which input signals are attenuated by at least 3 dB. For input signals having frequencies outside of the stop band, the attenuation provided by the bandstop filter is less than 3 dB.

Figure 3:
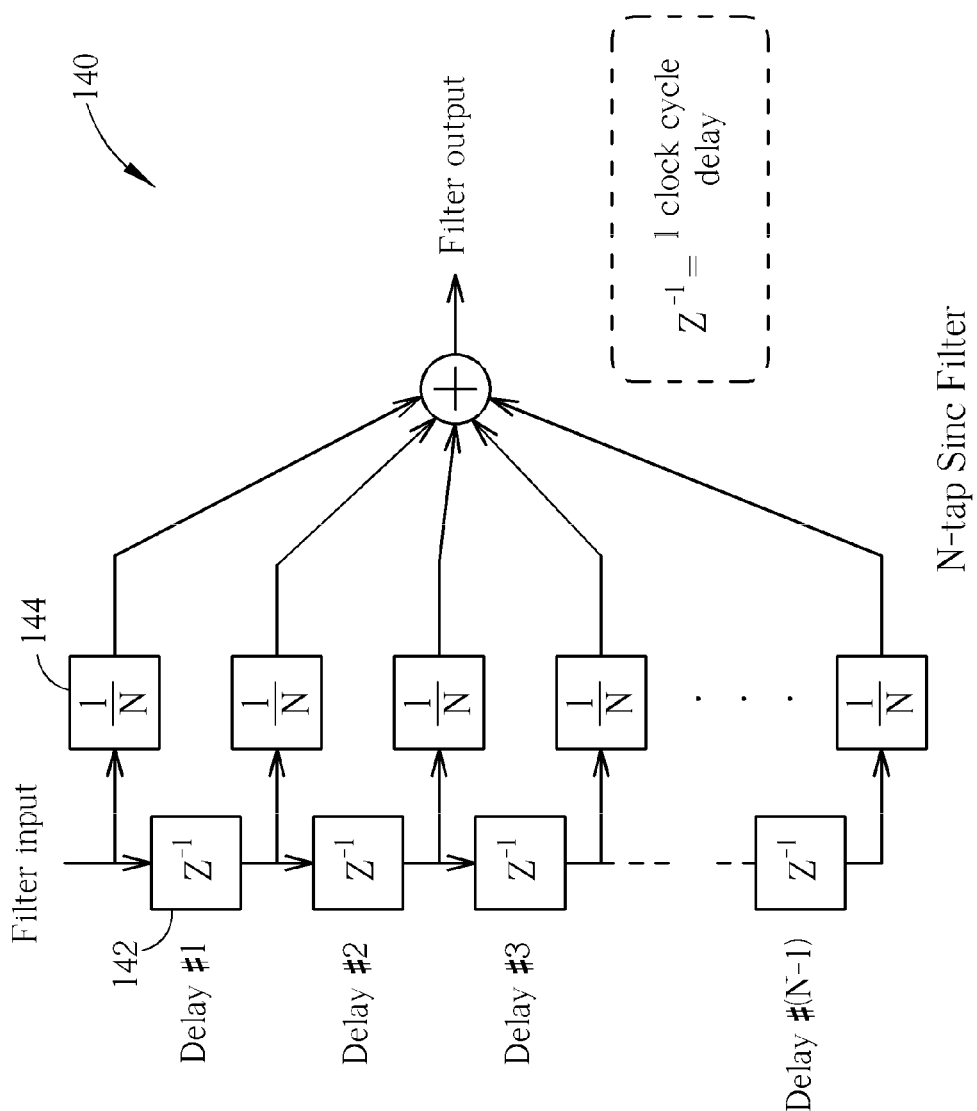
FIG. 3 is a block diagram of a sinc filter.
Figure 4:
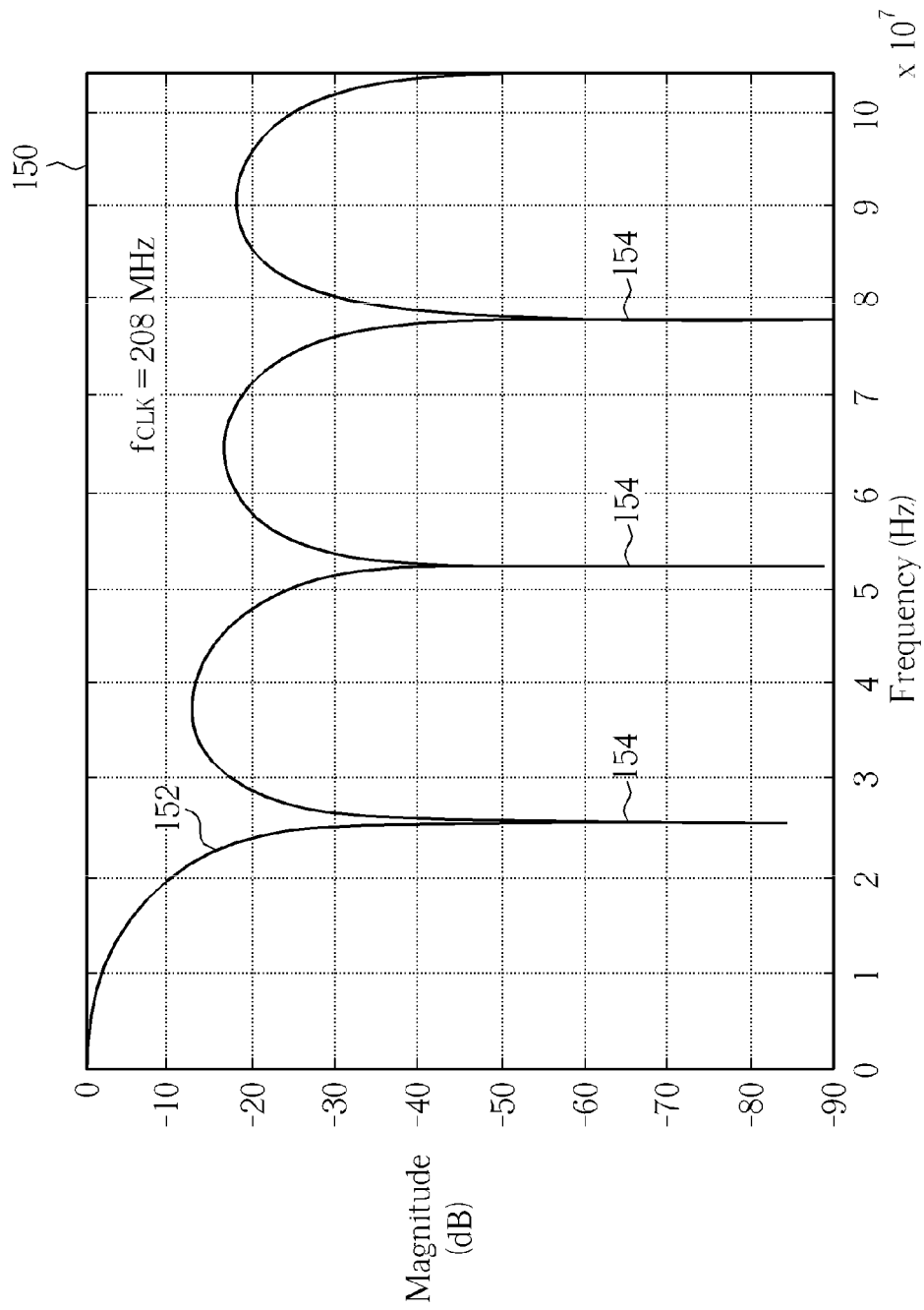
FIG. 4 is a graph of the frequency response of the sinc filter of FIG. 3.

FIG. 4 is a graph 150 of the frequency response 152 of the sinc filter 140 of FIG. 3 with N equal to 8. In the frequency domain, the transfer characteristic of the sinc filter 140 has a low-pass shape, reducing the signal content at higher frequencies. In addition, the sinc filter 140 has notches 154 in its transfer function at integer multiples of $f_{CLK}/N$, where N is the number of taps in the filter and $f_{CLK}$ is the clock frequency used by the sinc filter. The term "notch" refers to a narrow frequency range where the transfer function of the filter either goes to zero or is greatly attenuated. By placing the notches 154 in the same frequencies as phase noise spurs on the clock signal 112, the noise mixed into the baseband by noise spurs can be significantly attenuated.

In the system 90 of FIG. 2, there may be spurs in the output clock signal 112 at multiples (harmonics) of the reference clock frequency. In this case, proper selection of N (the number of taps) will place notches in the transfer function of the digital filter 108 at the same frequencies as some or all of the spurs produced by the PLL (and/or noise coupling).

Figure 5:
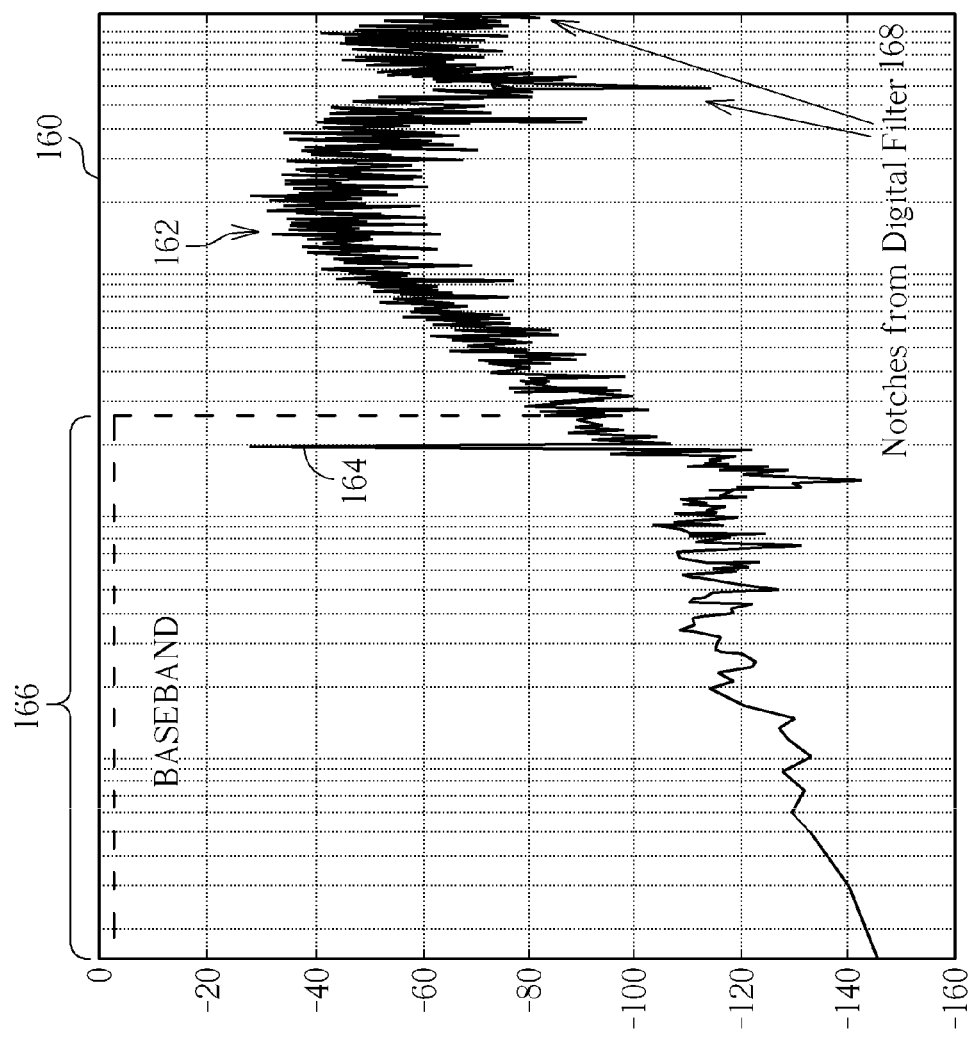
FIG. 5 is a frequency spectrum for the continuous-time Σ-Δ DAC of FIG. 2.

Referring to FIG. 5, a graph 160 shows an example output signal frequency spectrum 162 of the oversampled continuous-time DAC 100 of FIG. 2. The output signal frequency spectrum 162 includes a peak 164 representing a signal within a baseband frequency range 166 and several notches 168 that are outside of the baseband 166. In this example, a 4-tap sinc filter was used. The notches 168 have the effect of reducing noise mixed into the baseband 166. If large spurs exist in the clock signal 112 at the same frequencies as where the notches 168 are placed, there can be a significant reduction in the noise mixed into the baseband 166.

Figure 6:
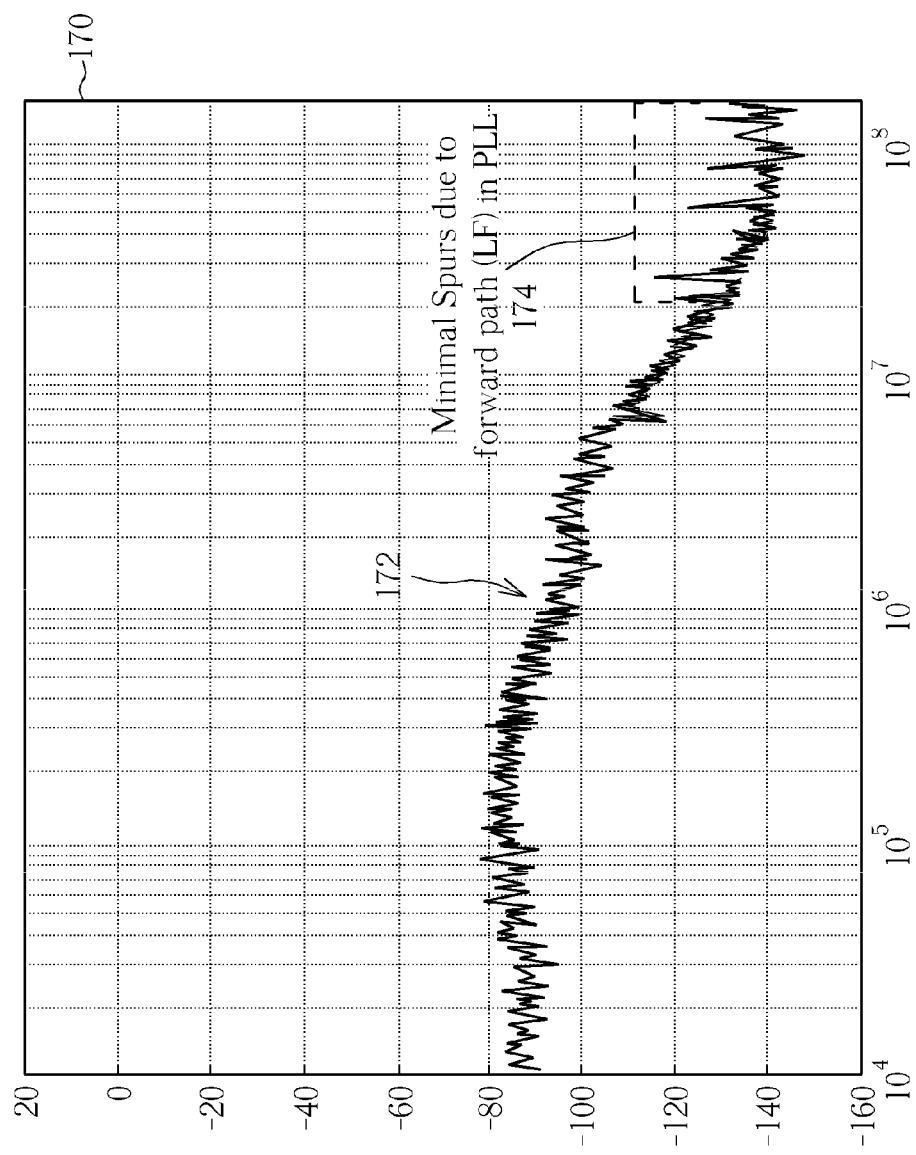
FIG. 6 is a graph showing an example of the phase noise spectrum of a relatively clean clock.

The following describes examples of frequency spectrums of clock signals that may be present in the system 90 of FIG. 2. Referring to FIG. 6, a graph 170 shows an example frequency spectrum 172 of a relatively clean clock signal having relatively small spurs 174 present at multiples of the reference clock frequency ($f_{REF}$) due to coupling within the forward path in the phase-locked-loop. In the graph 170, the horizontal axis represents frequency, and the vertical axis represents phase noise (dBc, decibels relative to carrier).

Figure 7:
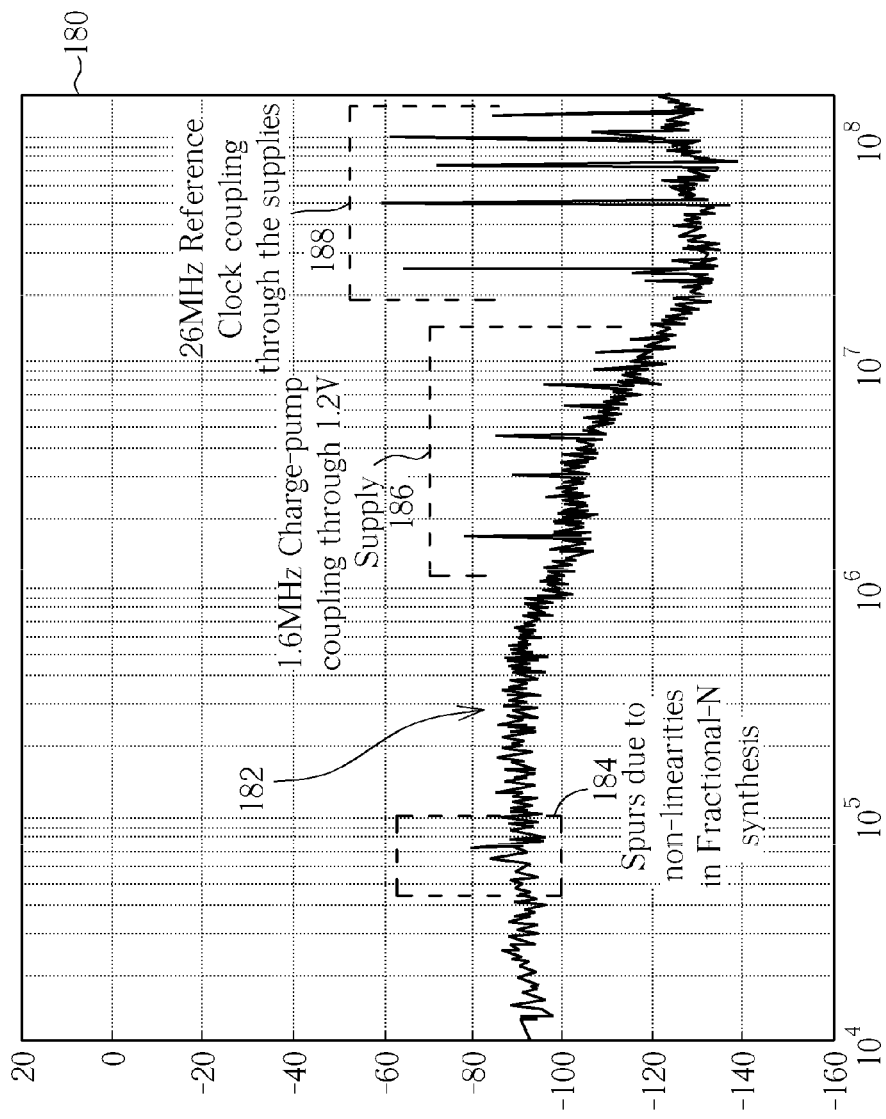
FIG. 7 is a graph showing an example of the phase noise spectrum of a noisy clock.

In some examples, with noisy and tightly packed circuitry, high levels of noise coupling can occur resulting in larger spurs on the clock signal. Referring to FIG. 7, a graph 180 shows an example frequency spectrum 182 of a noisy clock signal having multiple groups of spurs 184, 186, and 188 that originate from several different sources. Starting from the left of the graph 180, there is a pair of spurs 184 between 60 kHz and 80 kHz that result from nonlinearities in a fractional-N PLL. Moving up to 1.6 MHz and its harmonics, there is a block of spurs 186 that result from noise coupled through a power supply from a nearby charge-pump circuit operating at 1.6 MHz. Lastly, there are large spurs 188 that originate from a 26 MHz reference clock and its harmonics coupling through the supplies of a clock tree (clock distribution network). Any or all of these large phase noise peaks can mix (multiply) with the output of a continuous-time DAC 110 and place significant noise in the baseband frequency range.

By carefully designing the digital filter 108 to have notches at frequencies that match or are close to the frequencies of the phase noise spurs 184, 186, and/or 188, there can be a significant reduction in the noise mixed into the baseband.

In some examples, the digital filter 108 shown as a separate block in FIG. 2 can be combined with the continuous-time DAC 110. Various elements of the continuous-time DAC 110 can be scaled to match the filter coefficients of an FIR filter. The continuous-time DAC 110 is then used to implement the filter directly by controlling each filter element with the appropriately delayed value of the input to the filter. This structure is called an FIRDAC as outlined in "SD ADC with Finite Impulse Response Feedback DAC" by B. Putter, IEEE International Solid-State Circuits Conference, February 2004.

The same technique for reducing the mixing of noise spurs with signal content in the continuous-time sigma-delta DAC 100 of FIG. 2 is also applicable to an oversampled ADC, described below.

Improved Continuous-Time $\Sigma$-$\Delta$ ADC

Figure 8:
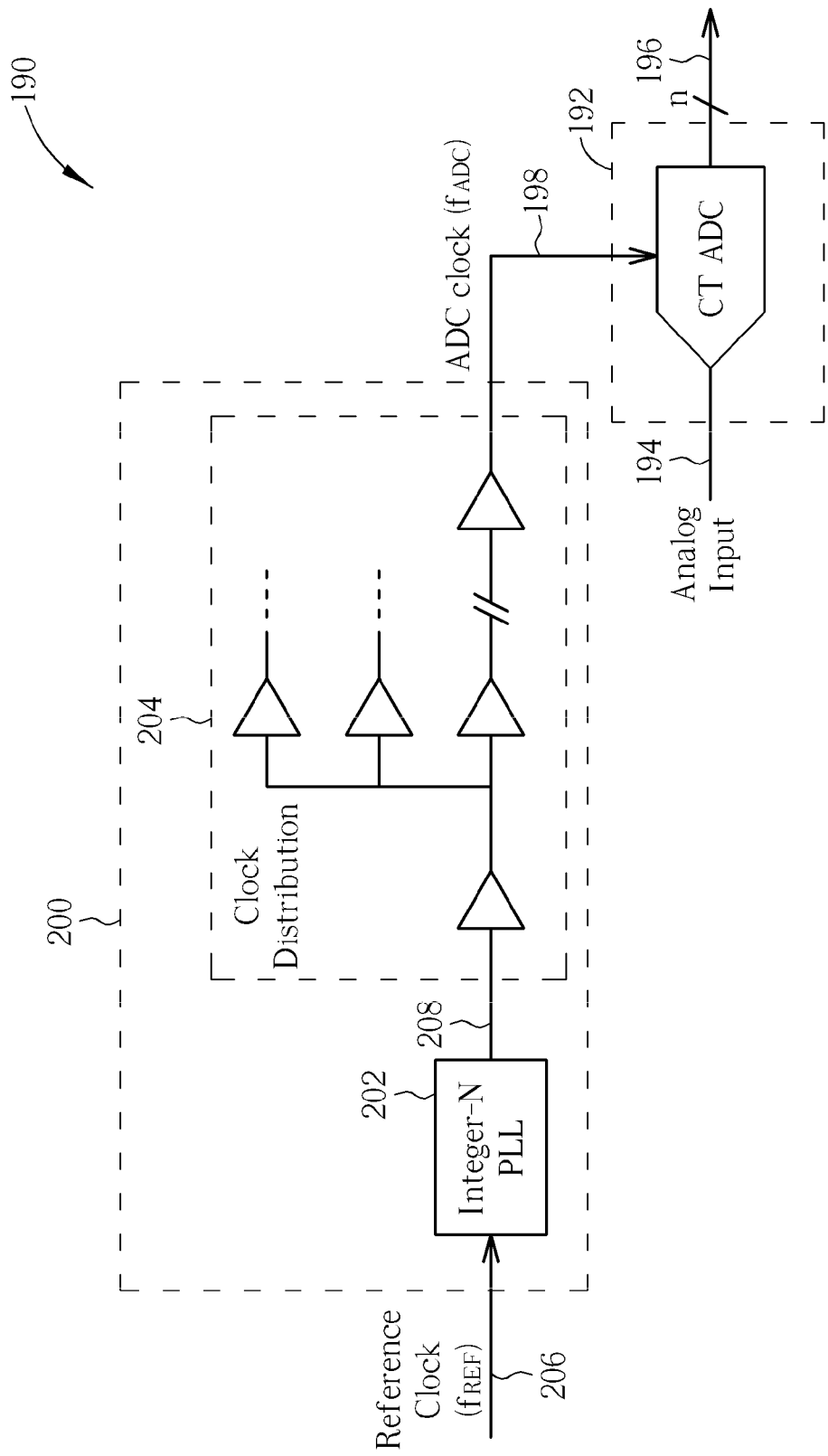
FIG. 8 is a diagram of a continuous-time Σ-Δ ADC receiving a clock signal from an integer-N PLL.

Referring to FIG. 8, in some implementations, a system 190 includes an oversampled continuous-time ADC (CT ADC) 192 that converts an analog input signal 194 into digital output data 196. The continuous-time ADC 192 receives a clock signal 198 (e.g., an ADC clock having the frequency $f_{ADC}$) from a clock generation and distribution circuitry 200, which includes an integer-N phase-locked-loop 202 and a clock distribution network (or clock tree) 204. In this example, the oversampled continuous-time ADC 192 is a continuous-time sigma-delta ADC. The integer-N PLL 202 receives an input reference clock 206 (e.g., having a frequency $f_{REF}$=26 MHz) and generates an output clock 208 at a multiple of the reference clock frequency. For example, the PLL 202 can increase the clock frequency by a factor of 16 and produce an output clock signal 208 having a frequency of 416 MHz. The 416 MHz clock signal 208 is routed through the clock distribution network 204. The 416 MHz clock signal 208 can be sent to the oversampled continuous-time ADC 192, or be divided down to 208 MHz before being sent to the oversampled continuous-time ADC 192.

The oversampled continuous-time ADC 192 can be, e.g., connected in series with a digital signal processor, or be part of a mixed-signal processing chain. The DAC 100 can be part of a system-on-a-chip that includes analog and digital circuitry. The system 190 can be any electronic device that uses an analog-to-digital converter, such as an audio encoder or video encoder. The oversampled continuous-time ADC 192 is useful in mobile devices, e.g., mobile phones, laptop computers, and tablet computers.

Figure 9:
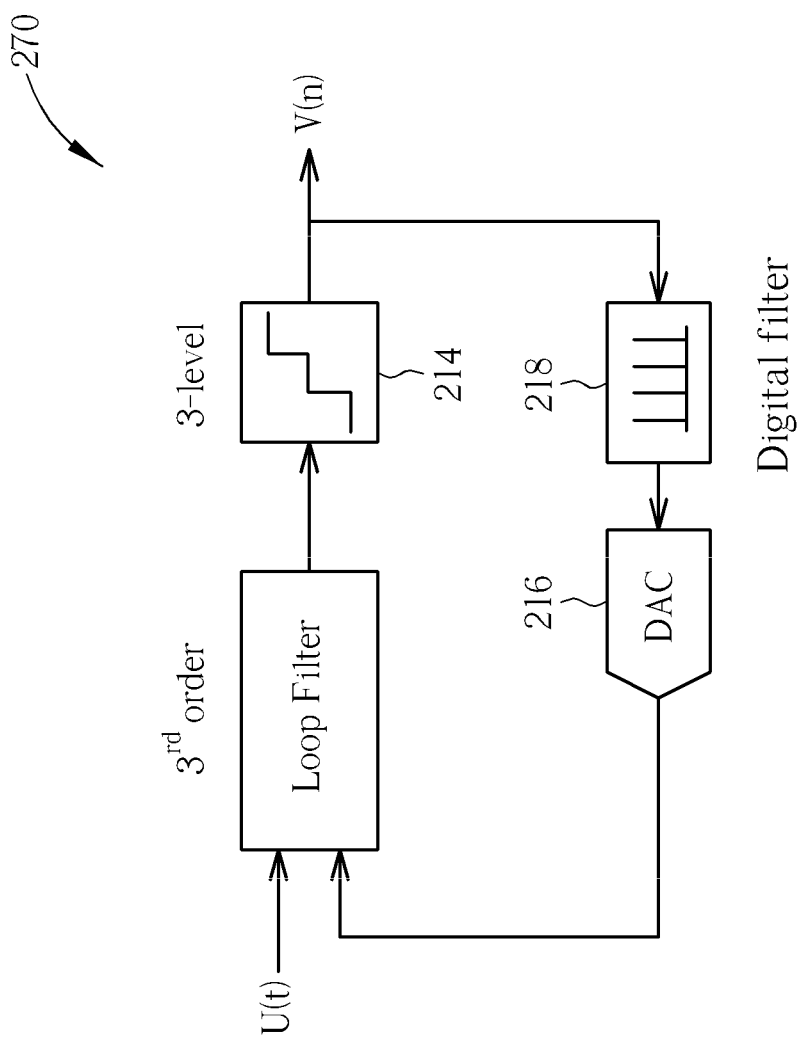
FIGS. 9-12 are diagrams of example continuous-time Σ-Δ ADCs.

The oversampled continuous-time ADC 192 can be implemented in many ways. Referring to FIG. 9, in some implementations, an oversampled continuous-time ADC 270 includes a loop filter 212, a quantizer 214, a feedback DAC 216, and a digital filter 218 placed in series with the feedback DAC 216. The oversampled continuous-time ADC 270 converts an analog input signal U(t) into digital output data V(n). For example, the loop filter 210 can be a $3^{rd}$ order loop filter and the quantizer 214 can be a three-level quantizer. The digital filter 218 can be, e.g., a sinc filter that has a frequency response having notches at frequencies that correspond to the frequencies of noise spurs in a clock signal used by the DAC 216. The filter notches remove or reduce the out-of-band content in the output V(n) (which is input to the DAC 216 in the feedback path) that would otherwise be mixed with the noise spurs in the clock signal resulting in jitter.

Figure 10:
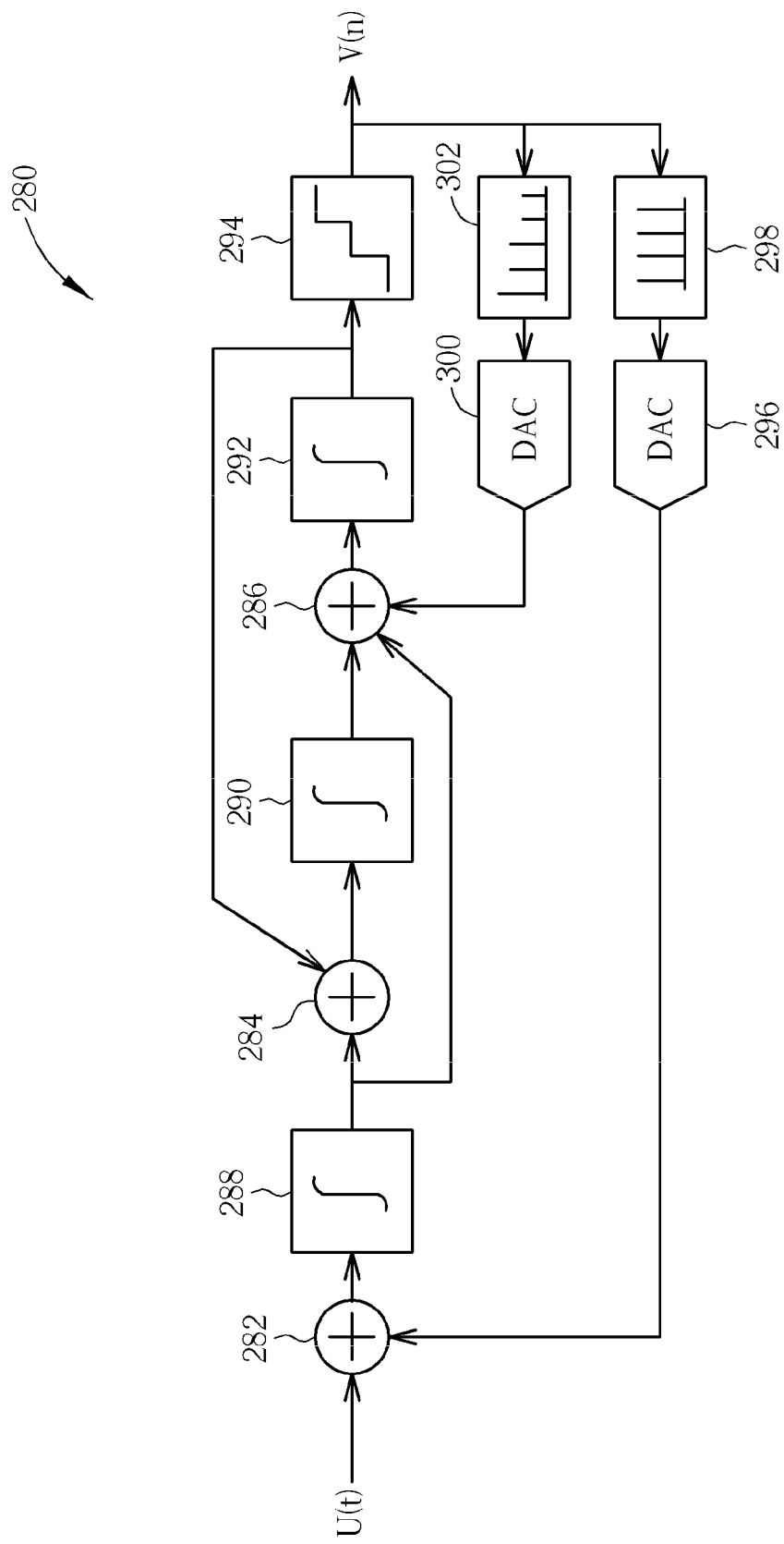

Referring to FIG. 10, in some implementations, an oversampled continuous-time ADC 280 has a hybrid feed-forward/feedback structure. The ADC 280 includes summation blocks 282, 284, 286, integrators 288, 290, 292, a quantizer 294, an outer feedback DAC 296, a digital filter 298 connected in series with the outer feedback DAC 296, an inner feedback DAC 300, and a digital filter 302 connected in series with the inner feedback DAC 300. In the oversampled continuous-time ADC 280, feedback paths are provide from the output V(n) to the input of the summation block 282 (through digital filter 298 and outer feedback DAC 296), from the output V(n) to the input of the summation block 286 (through digital filter 302 and inner feedback DAC 300), and from the output of the integrator 292 to the input of the summation block 284. A feed-forward path is provided from the output of the integrator 288 to the input of the summation block 286.

In some examples, the digital filter 298 is a 4-tap sinc filter that minimizes jitter due to noise. The digital filter 302 is a 4-element FIR filter, which together with the inner feedback DAC 300 compensates for the outer feedback delay (caused by the digital filter 298 which may be a sinc filter).

Figure 11:
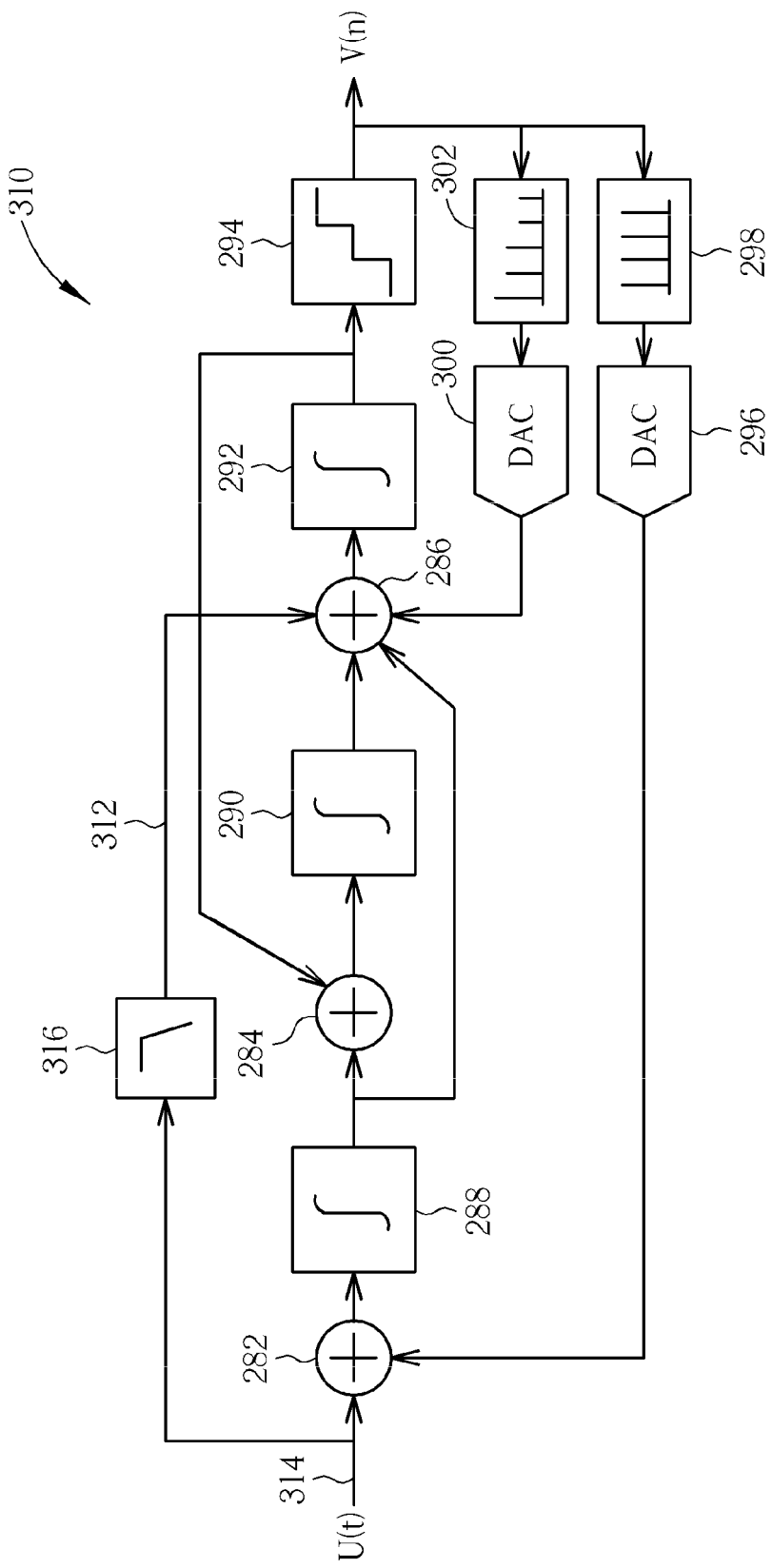

Referring to FIG. 11, in some implementations, an oversampled continuous-time-ADC 310 is similar to the oversampled continuous-time ADC 280, with the addition of a feed-forward path 312 from the modulator input (U(t)) 314 to the input of the summation block 286. The feed-forward path 312 suppresses low-frequency signal transfer function (STF) peaking. A low-pass filter 316 in the signal path 312 suppresses high-frequency components of the modulator input.

Figure 12:
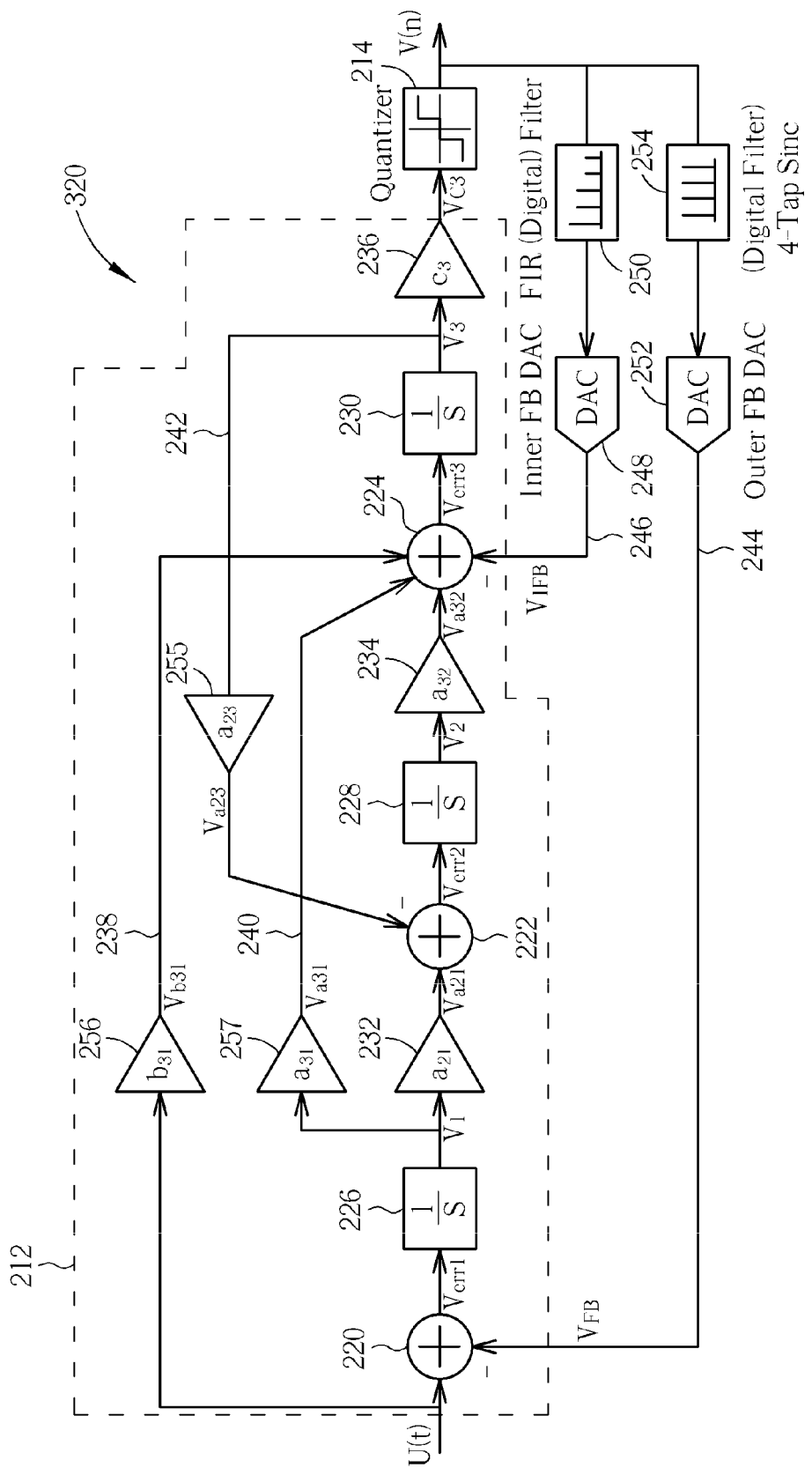

FIG. 12 shows an example sigma-delta ADC 320 that can be used to implement the continuous-time ADC 192 of FIG. 8. The sigma-delta ADC 320 includes a loop filter 212, a quantizer 214, an outer DAC feedback path 244, and an inner DAC feedback path 246. The loop filter 212 includes summation blocks 220, 222, 224, integrators 226, 228, 230, gain stages 232, 234, 236, feed forward paths 238, 240, and a feedback path 242. The outer DAC feedback path 244 includes an outer feedback continuous-time DAC 252 connected in series with a digital filter 254. The inner DAC feedback path 246 includes an inner feedback continuous-time DAC (Inner FB DAC) 248 connected in series with an FIR (digital) filter 250. For example, the digital filter 254 can be a 4-tap sinc filter. The sinc filter 254 introduces outer feedback delay, which can be compensated by the FIR (digital) filter 250, which can be, e.g., a five-element FIR filter.

Assume that the clock signal 198 provided to the sigma-delta ADC 320 has a frequency $f_{ADC}$ of 208 MHz, and has noise spurs (e.g., from the integer-N PLL 202, which has a reference frequency of 26 MHz) located at 26 MHz, 52 MHz, 78 MHz, and 104 MHz. The coefficients of the 4-tap sinc filter 254 are selected such that the filter has a frequency response having notches at $f_{CLK}/2$ and $f_{CLK}/4$, or 104 MHz and 52 MHz, respectively. The output spectrum of the continuous-time DAC (Outer FB DAC) 252 can be similar to that shown in FIG. 5, which has notches 168. By placing the notches at the same frequencies as some of the spurs from the integer-N PLL 202, the noise mixed into the baseband is reduced. Because the notches in the continuous-time DAC 252 output spectrum are placed at 52 MHz and 104 MHz, the noise that would otherwise be mixed into the baseband by the two noise spurs will be greatly reduced. The coefficients of the FIR (digital) filter 250 in the inner DAC feedback path 246 are selected to compensate for the feedback delay caused by the sinc filter 254.

The operation of the continuous-time sigma-delta ADC 320 in FIG. 12 can be explained as follows.

The input to the ADC 320, U(t), is applied to the summation block 220. Feedback from the output of the outer feedback DAC 252, $V_{FB}$, is also applied to the summation block 220 where it is subtracted from the input U(t) to form a signal $V_{err1}$. The signal $V_{err1}$ is applied to the input of the integrator 226. The output of the integrator 226, $V_1$, is passed through a gain stage ($a_{21}$) 232, and applied to the summation block 222. The summation block 222 receives a negative input $V_{a23}$ from a gain element ($a_{23}$) 255, which is fed back from the output of the later integrator stage, the integrator 230. The output of the summation block 222 is passed to the integrator 228, to form a signal $V_2$. The signal $V_2$ is scaled by the gain element ($a_{32}$) 234 to form a signal $V_{a32}$, which is provided as a positive input to the summing block 224.

Additional positive inputs to the summing block 224 include a signal $V_{b31}$, scaled from the input U(t) by a block ($b_{31}$) 256, and a signal $V_{a31}$, scaled from the output of the integrator 226 by a block ($a_{31}$) 257. A signal $V_{IFB}$, the negative input to the summing block 224, is subtracted from the positive inputs to generate a signal $V_{err3}$. The signal Verr3 is applied to the input of integrator 230 in order to generate an output signal $V_3$. The output signal $V_3$ is scaled by a gain element ($c_3$) 236, thus generating a signal $V_{c3}$ that is applied to an input of the quantizer 214. The output V(n) of the quantizer 214 is the digital output of the continuous-time sigma-delta ADC 320. The output V(n) is also fed back to the inputs of the inner feedback DAC 248 and the outer feedback DAC 252.

The interconnections of feedback branches, gain blocks, and integrator stages of the continuous-time sigma-delta ADC 320 are used to provide a specific transfer function for the continuous-time converter. The large low-frequency gain provided by the multiple integrators forces the signal $V_{FB}$, the output of the outer feedback DAC 252, to closely track the value seen at the input, U(t). This in turn forces V(n), the digital output of the continuous-time sigma-delta ADC 320, to closely track the input signal U(t) as necessary for proper operation.

There are two important transfer functions associated with the converter 320, the noise transfer function (NTF) and the signal transfer function (STF). The signal transfer function quantifies the relationship between the input to the ADC, U(t), and its output V(n), versus frequency. In some examples, it is desirable to maintain a relatively flat STF throughout the pass-band of the continuous-time sigma-delta ADC 320. The noise transfer function of the converter 320 represents the transfer function between quantization noise injected at the quantizer 214 and the output of the continuous-time sigma-delta ADC 320, V(n). To achieve optimal performance, the NTF should be shaped such that quantization errors are dominantly located outside of the pass-band of the ADC 320. For a typical low-pass ADC, this means the resulting NTF will have a high-pass characteristic, as is the case here.

Errors resulting from finite resolution in the quantizer are referred to as quantization noise, or Q-noise. This error represents the difference between the input voltage of the quantizer and the value represented at the output. Although the latter is in digital form, it still represents a specific analog voltage that can be compared with the quantizer input in order to determine the resulting error.

In designing the oversampling continuous-time ADC 320, a linear model of the ADC 320 can be developed, and the coefficients of the various gain blocks within the converter 320 can be determined in such a way as to achieve a targeted NTF.

Figure 13:
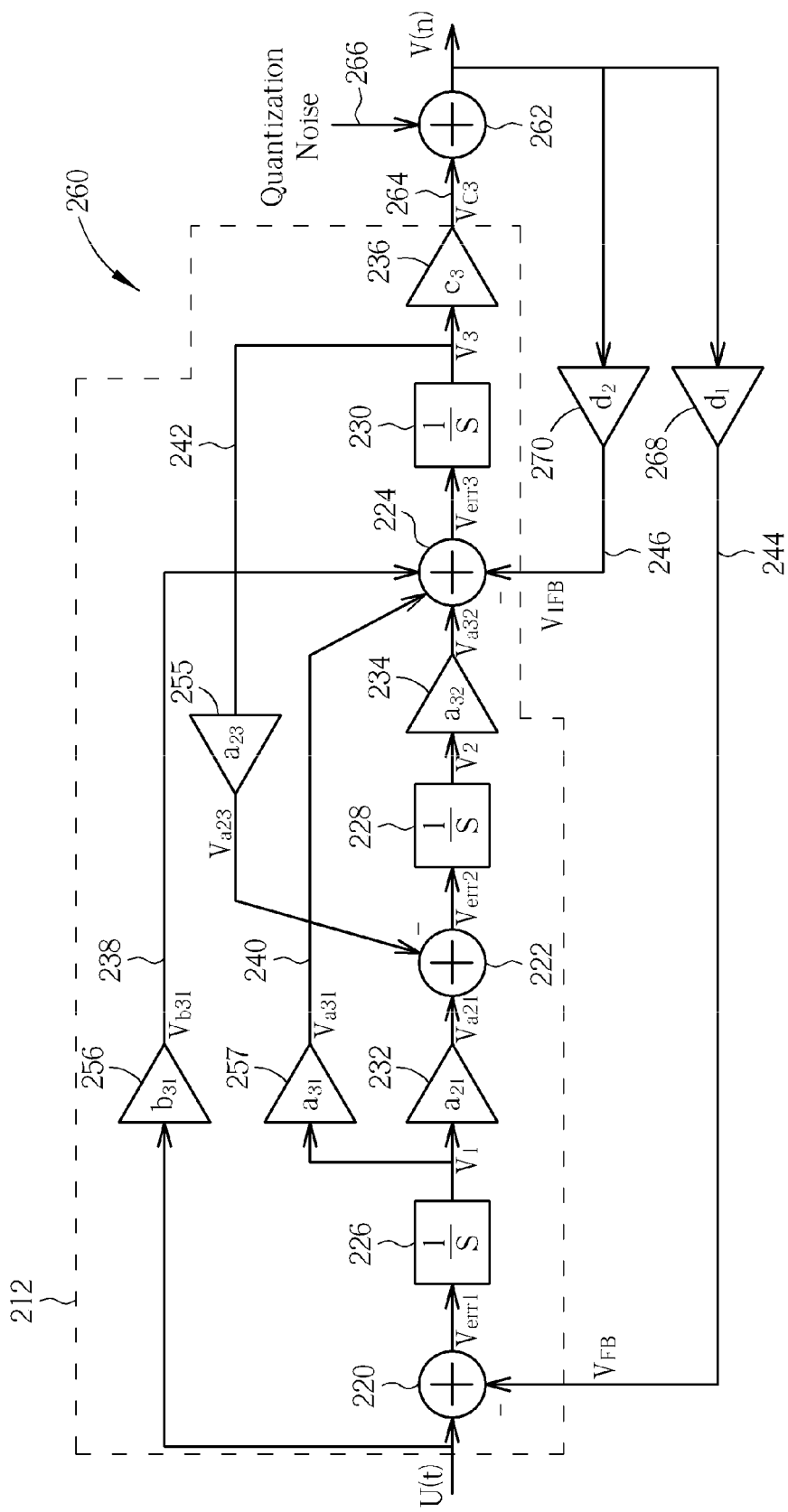
FIG. 13 is a diagram of a linear model of a continuous-time Σ-Δ ADC.

Referring to FIG. 13, a linear model 260 of a continuous-time ADC (identical to ADC 320 except without filters 254, 250) can be developed by replacing the quantizer 214 with a summer 262 having a first input 264 from the previous stage and a second input 266 for the quantization noise. Thus, the output V(n) represents the desired signal plus quantization error. In addition, the feedback DACs (e.g., 252 and 248 in FIG. 12) are replaced by ideal gain elements ($d_1$) 268, ($d_2$) 270 that scale for any implicit gain that occurs within the feedback DACs. Once the linear model 260 is developed, the coefficients of the various gain blocks within the converter are determined in a way such that the loop filter achieves a targeted NTF.

Although the linear model 260 in FIG. 13 does not include the digital filters 254 and 250 (FIG. 12), the same procedure described above can also be used in designing the continuous-time sigma-delta ADC 320 of FIG. 12, which includes the digital filters 254, 250 connected in series with the feedback DACs 252, 248, respectively. In this case, the coefficients of the digital filters 254, 250 are adjusted as part of the tuning of the impulse response as needed to achieve the target performance. For example, the 4-tap sinc filter 254 can be designed such that the notch frequencies match the noise spur frequencies, then the FIR (digital) filter 250 coefficients are selected in conjunction with other coefficients within the ADC, in order to tune the impulse response to achieve the target noise transfer function.

In some implementations, the digital filters 108 (FIG. 2), 218 (FIG. 9), 298, 302 (FIG. 10), 250, 254 (FIG. 12) can be filters having programmable coefficients that can be selected to adjust the notch frequencies to match the frequencies of at least some of the noise spurs.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

For example, noise coupled into the ADC or DAC can come from sources different from those described above. Instead of using a phase-locked-loop (e.g., 116 or 202) in the clock generation and distribution circuitry (e.g., 114 or 200), a delay-locked-loop can be used. The phase-locked-loop (e.g., 116) can be, e.g., an integer-N phase-locked loop or a fractional-N phase-locked loop. In an integer-N PLL, the output clock frequency of the PLL is an integer multiple of the input clock frequency. In a fractional-N PLL, the output clock frequency of the PLL may be a non-integer multiple of the input clock frequency. For example, a fractional-N PLL may receive a 1 MHz input clock signal and generate a 25.7 MHz output clock signal. Each of the digital filters 108 (FIG. 2), 218 (FIG. 9), 298, 302 (FIG. 10), 250, 254 (FIG. 12) can be, e.g., a finite impulse response (FIR) filter, an infinite impulse response (IIR) filter, or a combination of an FIR filter and an IIR filter. The notch in the filter transfer function of each of the digital filters 108 (FIG. 2), 218 (FIG. 9), 298 (FIG. 10), 250 (FIG. 12) can be set at a frequency that matches the reference clock (e.g., 120 of FIG. 2 or 206 of FIG. 8) frequency or a harmonic of the reference clock frequency.

Figure 14A:
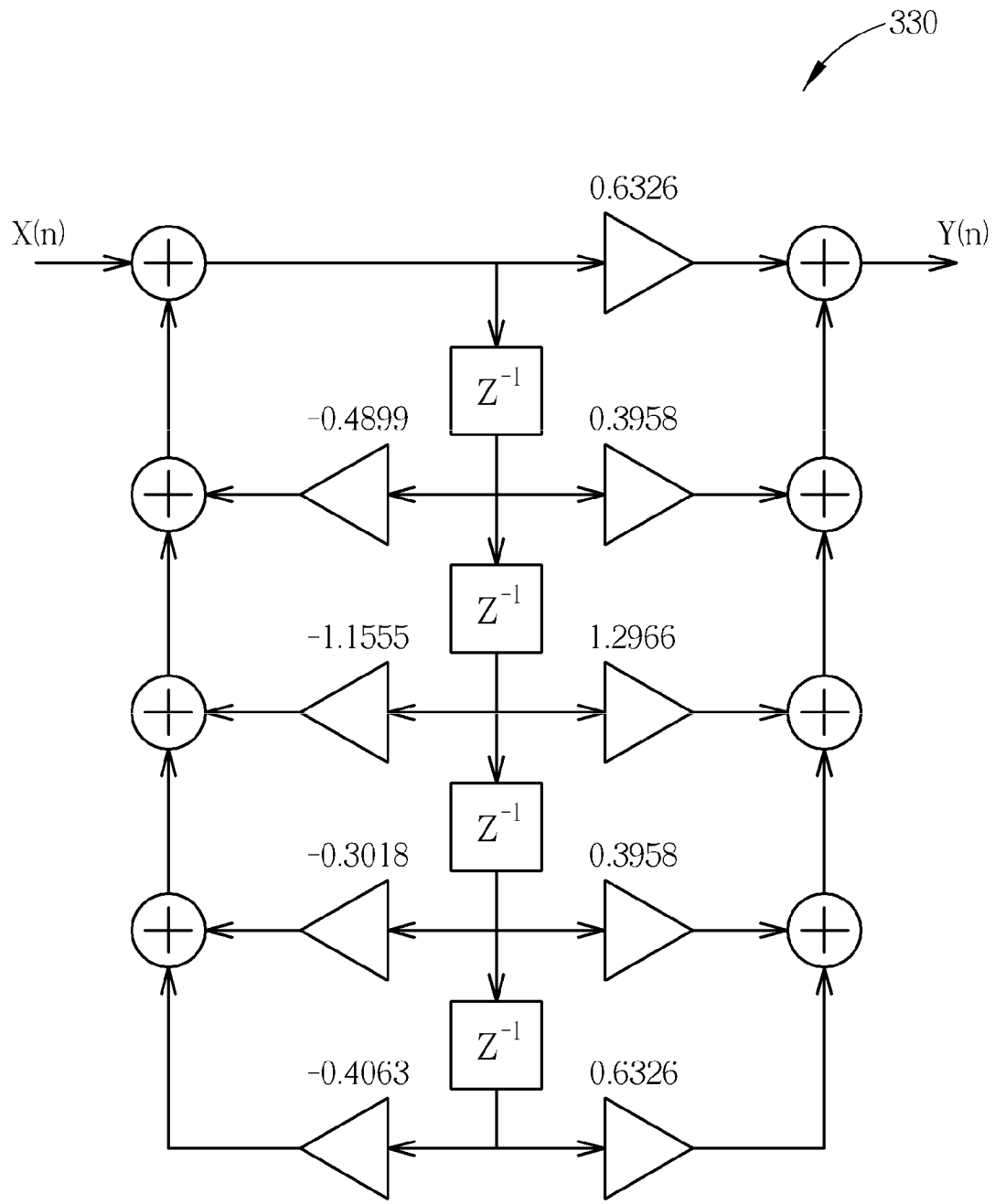
FIG. 14A is a diagram of an example bandstop IIR filter.
Figure 14B:
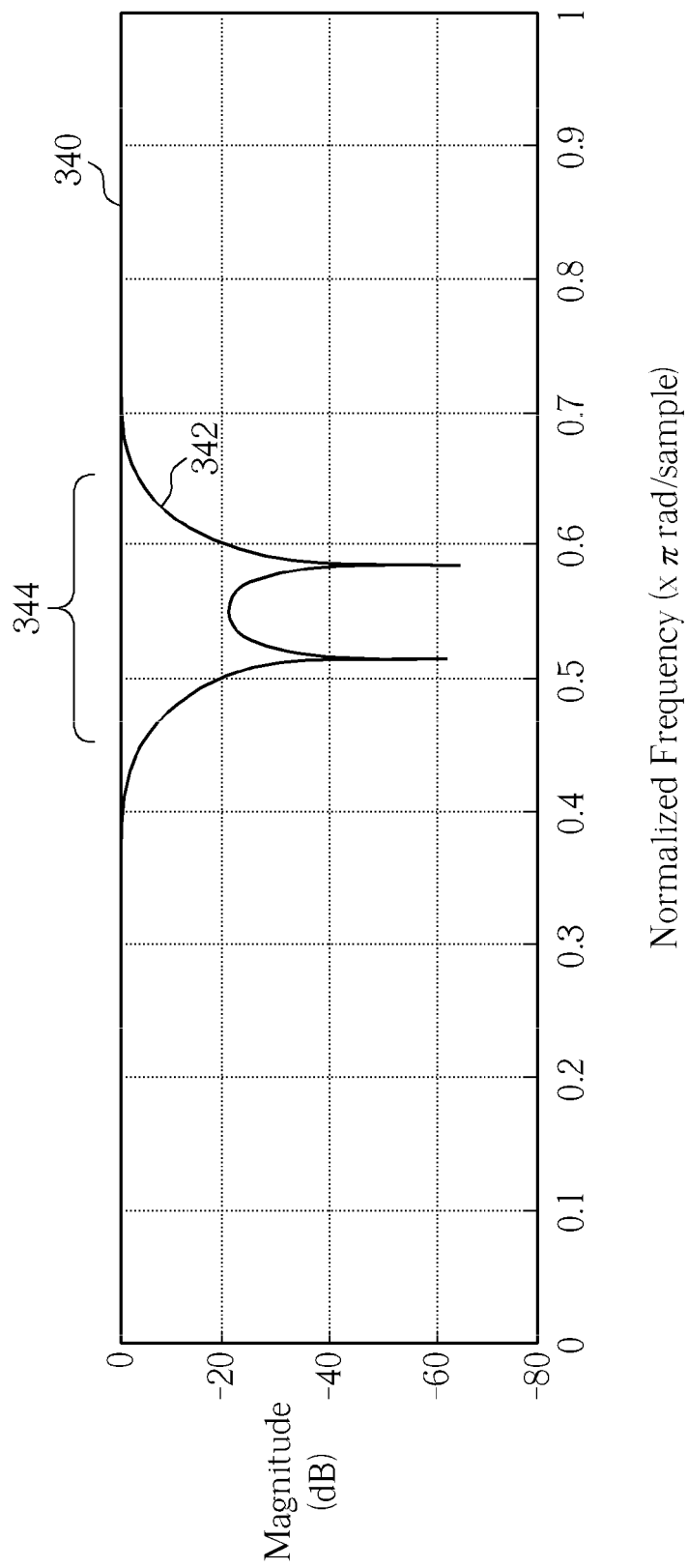
FIG. 14B is a graph of the frequency response of the filter of FIG. 14A.

The digital filter 108 can be a digital bandstop filter. Referring to FIG. 14A, a digital bandstop filter 330 can be an IIR digital filter. In this example, the bandstop filter 330 is implemented as a $4^{th}$ order Chebychev type II bandstop filter. Referring to FIG. 14B, a graph 340 shows the frequency response 342 of the bandstop filter 330. The bandstop filter 330 attenuates signals having frequencies within a stop band 344.

Figure 15A:
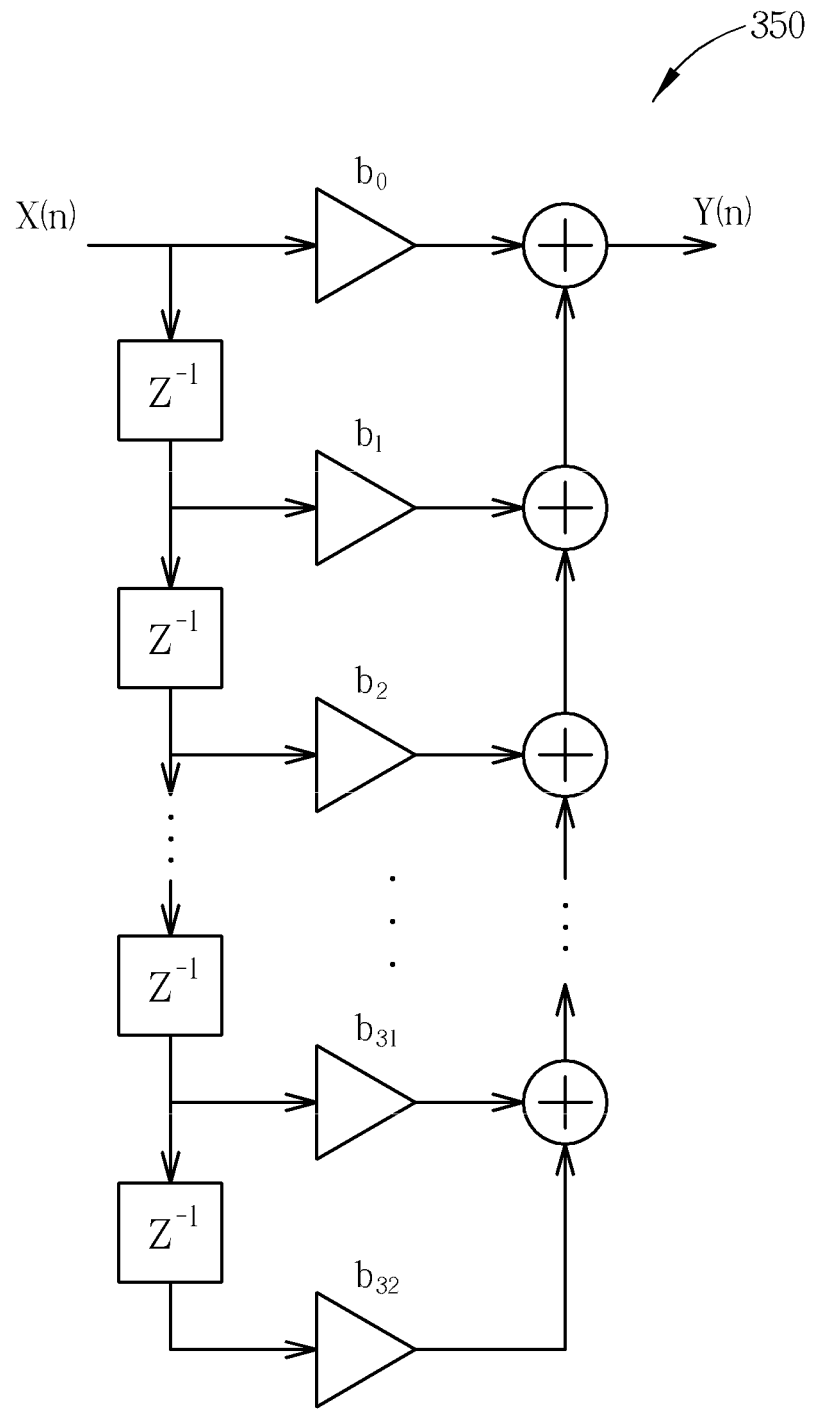
FIG. 15A is a diagram of an example bandstop FIR filter.
Figure 15B:
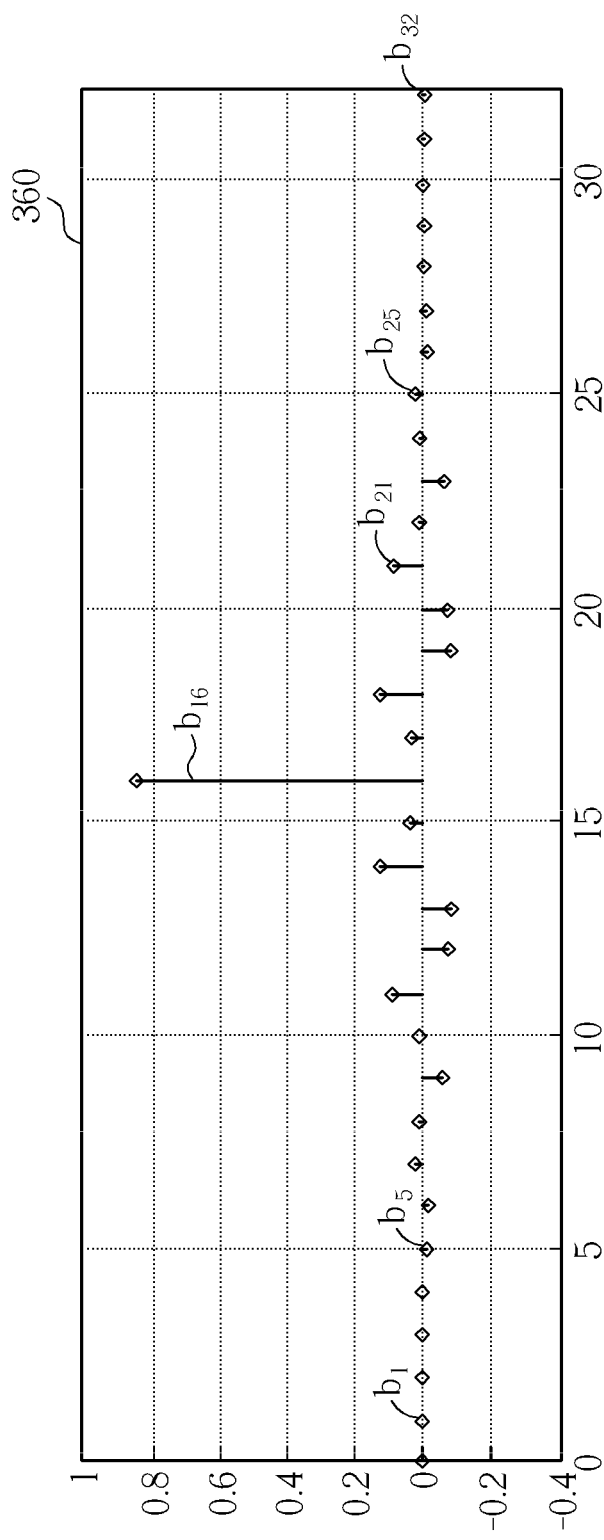
FIG. 15B is a graph showing the FIR coefficient values.
Figure 15C:
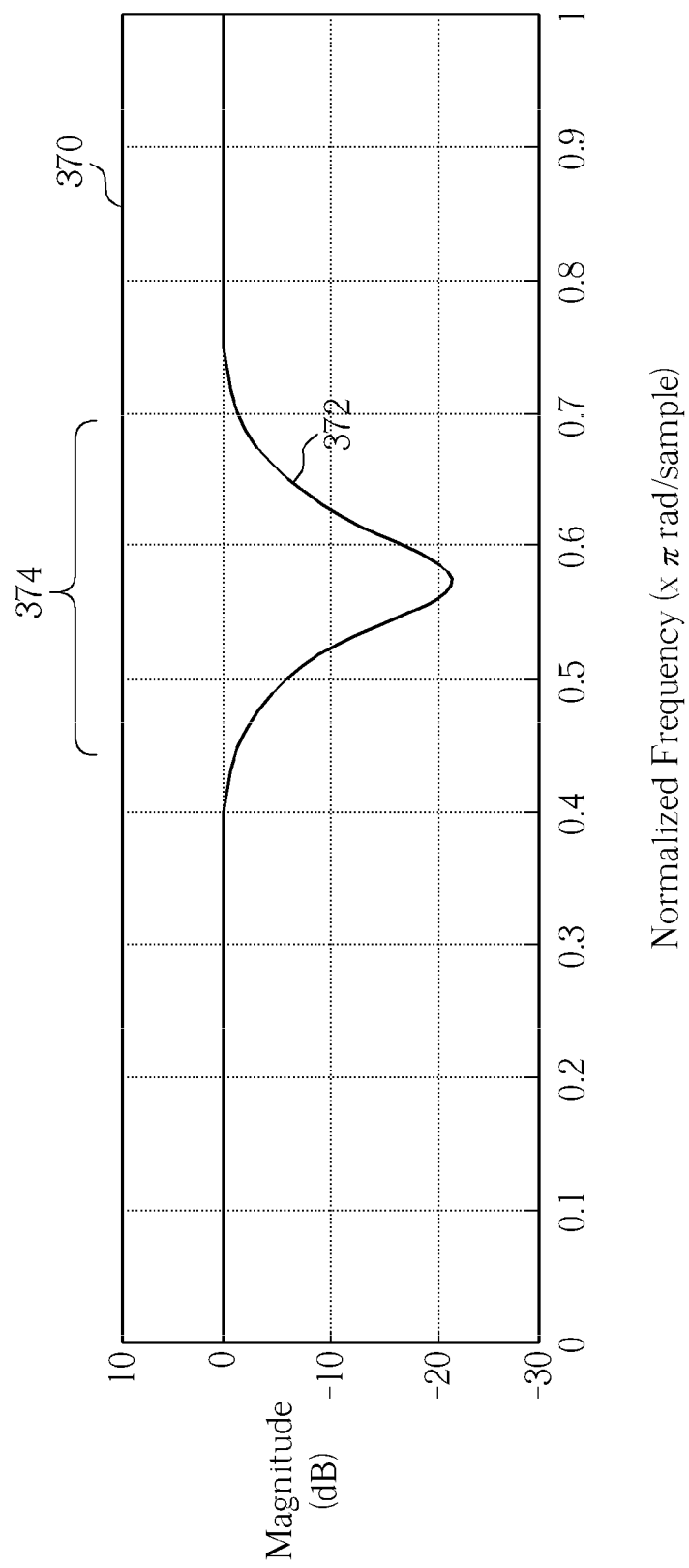
FIG. 15C is a graph of the frequency spectrum of the filter of FIG. 15A.

Referring to FIG. 15A, a digital bandstop filter 350 can be an FIR filter. In this example, the bandstop filter 350 is implemented as a $32^{nd}$ order bandstop FIR filter, which includes 33 coefficients, $b_0$-$b_{32}$. Referring to FIG. 15B, a graph 360 shows the values of the FIR coefficients, $b_0$-$b_{32}$. Referring to FIG. 15C, a graph 370 shows the frequency response 372 of the bandstop filter 350. The bandstop filter 350 attenuates signals having frequencies within a stop band 374. The frequency response 372 of the FIR filter 350 has softer corners compared to that of the IIR filter 330.

The baseband of a system (e.g., 90, 190) refers to the signal band covering the signals of interest to the system. For example, the signal band may extend a predetermined frequency range, such as 0-44.1 KHz, or 1 MHz to 2 MHz. For example, where the system 90, 190 is a mobile phone, the baseband or signal band includes the signals of interest, such as the voice, data, and control signals. In the example where the signal band is from 1 MHz to 2 MHz, the oversampling can be designed to minimize (or reduce) the quantization noise within the signal band (1 MHz to 2 MHz), and the digital filter placed in front of the continuous-time DAC or continuous-time ADC is designed such that the amount of noise outside of the signal band that mixes with the noise spurs and enters the signal band is minimized (or reduced).

The oversampled continuous-time ADC 192 can have configurations different from those described above. For example, the ADC 192 can have feed-forward and feedback paths different from those described above, and the gain coefficients can also be different. The clock source can be, e.g., a calibrated oscillator with periodic re-calibration. The analog signal being converted by the oversampled continuous-time ADC 192 or 320 can be, e.g., a differential signal. Accordingly, other implementations are within the scope of the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   a clock source to generate a clock signal in which a noise signal is added to the clock signal as the clock signal is generated and/or routed;
   an oversampled continuous-time digital-to-analog converter comprising:
   a sigma-delta modulator to perform noise shaping on input digital data samples and provide intermediate data samples;
   a filter to filter the intermediate data samples and generate filtered samples, the filter having a transfer function that has a stop band at a frequency range that includes the frequency of the noise signal or a component of the noise signal; and
   a continuous-time digital-to-analog converter to convert the filtered samples to an output analog signal;
   wherein the clock signal or a signal derived from the clock signal is used by one or more components of the oversampled continuous-time digital-to-analog converter.

2. The apparatus of claim 1 in which the filter transfer function has a notch at a frequency that matches the frequency of the noise signal or a component of the noise signal.

3. The apparatus of claim 2 in which the clock source comprises a phase-locked loop or a delay-locked loop having a reference clock operating at a reference clock frequency, and the notch in the filter transfer function is set at a frequency that matches the reference clock frequency or a harmonic of the reference clock frequency.

4. The apparatus of claim 1 in which the input digital data samples are associated with an analog signal, having component frequencies within a frequency band of interest, the sigma-delta modulator performs noise shaping on the input data samples to reduce quantization noise of the filtered samples within the frequency band of interest and place some of the quantization noise outside of the frequency band of interest, and the stop band is outside of the frequency band of interest.

5. An apparatus comprising:
   a clock source to generate a clock signal in which a noise signal is added to the clock signal as the clock signal is generated and/or routed;
   an oversampled continuous-time analog-to-digital converter to convert an input analog signal to an output digital signal, the oversampled continuous-time analog-to-digital converter comprising:
   a quantizer to quantize a first intermediate signal and generate the output digital signal;
   a first filter to filter the output digital signal and generate a first filtered digital signal, the first filter having a transfer function that has a stop band at a frequency range that includes the frequency of the noise signal or a component of the noise signal;
   a first feedback continuous-time digital-to-analog converter to convert the first filtered digital signal to a first analog representation of the first filtered digital signal; and
   a first circuit to generate a second intermediate signal representing a difference between the input analog signal and the first analog representation of the first filtered digital signal;
   wherein the clock signal or a signal derived from the clock signal is used by one or more components of the oversampled continuous-time analog-to-digital converter.

6. The apparatus of claim 5 in which the first filter transfer function has a notch at a frequency that matches the frequency of the noise signal or a component of the noise signal.

7. The apparatus of claim 6 in which the clock source comprises a phase-locked loop or a delay-locked loop having a reference clock operating at a reference clock frequency, and the notch in the first filter transfer function has a frequency that matches the reference clock frequency or a harmonic of the reference clock frequency.

8. The apparatus of claim 5 in which the input analog signal has component frequencies within a frequency band of interest, the quantizer, the first filter, the feedback digital-to-analog converter, and the first circuit form a sigma-delta modulator that performs noise shaping to reduce quantization noise of the output digital signal within the frequency band of interest and place some of the quantization noise outside of the frequency band of interest, and the stop band is outside of the frequency band of interest.

9. The apparatus of claim 5, further comprising:
   a second filter to filter the output digital signal and generate a second filtered digital signal;
   a second feedback continuous-time digital-to-analog converter to convert the second filtered digital signal to a second analog representation of the second filtered digital signal; and
   a second circuit to generate a third intermediate signal representing a difference between a processed version of the second intermediate signal and the second analog representation of the second filtered digital signal.

10. An apparatus comprising:
an oversampled continuous-time digital-to-analog converter comprising:
a first filter to filter an oversampled digital signal and generate a filtered oversampled digital signal, the filter having a transfer function that has a stop band at a frequency range that includes the frequency of a noise signal, the stop band being outside of a frequency band of interest;
a continuous-time digital-to-analog converter to convert the filtered samples to a first analog signal; and
a second filter to filter the first analog signal and generate an output analog signal, the second filter reducing components in the output analog signal having frequencies outside of the frequency band of interest.

11. The apparatus of claim 10, further comprising a clock source that generates a clock signal in which a phase noise peak is added to a noise level of the clock signal as the clock signal is generated and/or routed, wherein the first filter transfer function includes a notch that occurs at a frequency that matches the frequency of the phase noise peak.

12. An apparatus comprising:
an oversampled continuous-time analog-to-digital converter to convert an input analog signal to an output digital signal, the oversampled continuous-time analog-to-digital converter comprising:
a quantizer to quantize a first intermediate signal and generate the output digital signal;
a first filter to filter the output digital signal and generate a first filtered digital signal, the first filter having a transfer function having a stop band at a frequency range that includes the frequency of a noise signal;
a first feedback continuous-time digital-to-analog converter to convert the first filtered digital signal to a first analog representation of the first filtered digital signal; and
a first circuit to generate a second intermediate signal representing a difference between the input analog signal and the first analog representation of the first filtered digital signal.

13. The apparatus of claim 12, further comprising a clock source that generates a clock signal in which phase noise peaks are added to a noise level of the clock signal as the clock signal is generated and/or routed, wherein the first filter transfer function includes a notch that occurs at a frequency that matches at least one frequency of the noise peaks.

14. The apparatus of claim 12, further comprising:
a second filter to filter the output digital signal and generate a second filtered digital signal, the second filter compensating for feedback delays produced by the first filter; and
a second feedback continuous-time digital-to-analog converter to convert the second filtered digital signal to a third intermediate signal that is fed into a second feedback loop.

15. An apparatus comprising:
an oversampled continuous-time converter to convert an input signal into an output signal having a format that is different from the input signal, the continuous-time oversampled converter comprising:
a filter to filter an oversampled digital signal and generate a filtered signal, the filter having a transfer function having a stop band at a frequency range that includes a frequency of a noise signal, the stop band being outside of a frequency band of interest; and
a continuous-time digital-to-analog converter to convert the filtered signal to an analog signal.

16. The apparatus of claim 15 in which the oversampled continuous-time converter comprises an oversampled continuous-time digital-to-analog converter, the input signal comprises a digital signal, and the output signal comprises the analog signal or a filtered version of the analog signal.

17. The apparatus of claim 15 in which the oversampled continuous-time converter comprises an oversampled continuous-time analog-to-digital converter having a quantizer that generates the oversampled digital signal, and the analog signal from the continuous-time digital-to-analog converter is fed into a feedback loop.

18. The apparatus of claim 15 in which the filter transfer function has a notch at a frequency that matches the frequency of the noise signal or a component of the noise signal.

19. A method of converting input digital data samples to an output analog signal, the method comprising:
routing a clock signal having a noise signal;
filtering oversampled digital data having components outside of a signal band of interest, by using a filter having a transfer function that has a stop band at a frequency that matches the frequency of the noise signal or a component of the noise signal, to generate filtered samples, the stop band being outside of the signal band of interest; and
converting, using a continuous-time digital-to-analog converter, the filtered samples to an output analog signal.

20. The method of claim 19, further comprising:
generating the clock signal using a phase-locked loop or a delay-locked loop having a reference clock operating at a reference clock frequency, and setting a notch in the filter transfer function at a frequency that matches the reference clock frequency or a harmonic of the reference clock frequency.

21. The method of claim 19 in which the filter transfer function has a notch at a frequency that matches the frequency of the noise signal or a component of the noise signal.

22. A method of converting an input analog signal to an output digital signal, the method comprising:
generating a clock signal;
routing the clock signal, in which a noise signal is added to the clock signal as the clock signal is generated and/or routed;
quantizing a first intermediate signal and generating an output digital signal;
filtering the output digital signal and generating a filtered digital signal using a filter having a transfer function that has a stop band at a frequency range that includes the frequency of the noise signal or a component of the noise signal;
converting, using a feedback continuous-time digital-to-analog converter, the filtered digital signal to an analog representation of the filtered digital signal; and
generating a second intermediate signal representing a difference between an input analog signal and the analog representation of the filtered digital signal.

23. The method of claim 22, further comprising: generating the clock signal using a phase-locked loop or a delay-locked loop having a reference clock operating at a reference clock frequency, and setting a notch in the filter transfer function at a frequency that matches the reference clock frequency or a harmonic of the reference clock frequency.

24. The method of claim 22 in which the first filter transfer function has a notch at a frequency that matches the frequency of the noise signal or a component of the noise signal.

25. An apparatus comprising:
an oversampled continuous-time digital-to-analog converter to convert digital input data to analog output data, the oversampled continuous-time digital-to-analog converter comprising:
- a filter to filter oversampled data and generate filtered data, the filter having a transfer function that has a stop band at a frequency range that is outside a signal band of interest and includes the frequency of a noise component of a clock signal; and
- a continuous-time digital-to-analog converter to convert the filtered data to the analog output signal, the continuous-time digital-to-analog converter using the clock signal or another signal derived from the clock signal.

26. The apparatus of claim 25 in which the filter transfer function comprises a notch at a frequency that matches the frequency of the noise signal or a component of the noise signal.

27. The apparatus of claim 25 in which the frequency of the noise signal corresponds to the frequency of a reference clock signal or a harmonic frequency of the reference clock signal.

28. An apparatus comprising:
an oversampled continuous-time analog-to-digital converter to convert an analog input signal to a digital output signal, the oversampled continuous-time analog-to-digital converter comprising:
- a quantizer to quantize a first intermediate signal and generate the output digital signal;
- a filter to filter the output digital signal and generate a filtered digital signal, the filter having a transfer function that has a stop band at a frequency range that is outside a signal band of interest and includes the frequency of a noise component of a clock signal;
- a feedback continuous-time digital-to-analog converter to convert the filtered digital signal to an analog representation of the filtered digital signal, the continuous-time digital-to-analog converter using the clock signal or another signal derived from the clock signal; and
- a circuit to generate a second intermediate signal representing a difference between the analog input signal and the analog representation of the filtered digital signal.

29. The apparatus of claim 28 in which the filter transfer function comprises a notch at a frequency that matches the frequency of the noise signal or a component of the noise signal.

30. The apparatus of claim 29 in which the frequency of the noise signal corresponds to the frequency of a reference clock signal or a harmonic frequency of the reference clock signal.

* * * * *